(12) United States Patent
Heo et al.

(10) Patent No.: US 10,505,146 B2
(45) Date of Patent: Dec. 10, 2019

(54) ORGANIC PHOTOELECTRONIC DEVICE AND IMAGE SENSOR AND ELECTRONIC DEVICE

(71) Applicant: Samsung Electronics Co., Ltd., Suwon-si, Gyeonggi-do (KR)

(72) Inventors: Chul Joon Heo, Busan (KR); Kyung Bae Park, Hwaseong-si (KR); Sung Young Yun, Suwon-si (KR); Tadao Yagi, Hwaseong-si (KR); Takkyun Ro, Hwaseong-si (KR); Gae Hwang Lee, Seongnam-si (KR); Kwang Hee Lee, Yongin-si (KR); Yong Wan Jin, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/623,801

(22) Filed: Jun. 15, 2017

(65) Prior Publication Data

US 2018/0062112 A1 Mar. 1, 2018

(30) Foreign Application Priority Data

Aug. 29, 2016 (KR) .................. 10-2016-0110234

(51) Int. Cl.
*H01L 27/30* (2006.01)
*H01L 51/00* (2006.01)
(Continued)

(52) U.S. Cl.
CPC ........ *H01L 51/5253* (2013.01); *H01L 27/307* (2013.01); *H01L 51/0062* (2013.01);
(Continued)

(58) Field of Classification Search
CPC ............... H01L 27/307; H01L 51/5253; H01L 51/0062; H01L 51/4253; H01L 51/424; H01L 51/4246; Y02E 10/549
See application file for complete search history.

(56) References Cited

U.S. PATENT DOCUMENTS 6,087,258 A 7/2000 Simpson et al.
6,300,612 B1 10/2001 Yu
(Continued)

FOREIGN PATENT DOCUMENTS

CN 104230953 A 12/2014
DE 102004014046 A1 9/2004
(Continued)

OTHER PUBLICATIONS

Hokuto Seo et al. "Color Sensors with Three Vertically Stacked Organic Photodetectors". Japanese Journal of Applied Physics vol. 46, No. 49. The Japan Society of Applied Physics. 2007. pp. L1240-L1242.
(Continued)

*Primary Examiner* — William F Kraig
*Assistant Examiner* — Vicki B. Booker
(74) *Attorney, Agent, or Firm* — Harness, Dickey & Pierce, P.L.C.

(57) ABSTRACT

An organic photoelectronic device includes a first electrode and a second electrode facing each other, and first and second photoelectronic conversion layers between the first electrode and the second electrode. The first and second photoelectronic conversion layers include a p-type semiconductor and an n-type semiconductor. The first photoelectronic conversion layer has a first composition ratio ($p^1/n^1$) of the p-type semiconductor relative to the n-type semiconductor, the second photoelectronic conversion layer has a second composition ratio ($p^2/n^2$) of the p-type semiconduc-
(Continued)

tor relative to the n-type semiconductor, and the first composition ratio ($p^1/n^1$) is greater than the second composition ratio ($p^2/n^2$).

21 Claims, 14 Drawing Sheets

(51) Int. Cl.
*H01L 51/42* (2006.01)
*H01L 51/52* (2006.01)

(52) U.S. Cl.
CPC ........ *H01L 51/424* (2013.01); *H01L 51/4246* (2013.01); *H01L 51/4253* (2013.01); *Y02E 10/549* (2013.01)

(56) References Cited

U.S. PATENT DOCUMENTS

| | | | |
|---|---|---|---|
| 6,824,952 | B1 | 11/2004 | Minsek et al. |
| 6,972,431 | B2 | 12/2005 | Forrest et al. |
| 7,129,466 | B2 | 10/2006 | Iwasaki |
| 7,141,863 | B1 | 11/2006 | Compaan et al. |
| 7,973,307 | B2 | 7/2011 | Rand et al. |
| 8,035,708 | B2 | 10/2011 | Takizawa et al. |
| 8,378,339 | B2 | 2/2013 | Nomura et al. |
| 8,426,727 | B2 | 4/2013 | Pfeiffer et al. |
| 8,471,246 | B2 | 6/2013 | Suzuki et al. |
| 8,525,577 | B2 | 9/2013 | Yofu et al. |
| 8,637,860 | B2 | 1/2014 | Nomura et al. |
| 8,704,213 | B2 | 4/2014 | Suzuki |
| 8,704,281 | B2 | 4/2014 | Maehara et al. |
| 8,847,141 | B2 | 9/2014 | Fukuzaki et al. |
| 8,847,208 | B2 | 9/2014 | Mitsui et al. |
| 8,860,016 | B2 | 10/2014 | Suzuki |
| 8,933,438 | B2 | 1/2015 | Leem et al. |
| 8,994,132 | B2 | 3/2015 | Mitsui et al. |
| 9,070,888 | B2 | 6/2015 | Leem |
| 9,543,361 | B2 | 1/2017 | Leem et al. |
| 9,548,463 | B2 | 1/2017 | Yagi et al. |
| 9,960,362 | B2 | 5/2018 | Bulliard et al. |
| 2005/0217722 | A1 | 10/2005 | Komatsu et al. |
| 2006/0076050 | A1* | 4/2006 | Williams ............... B82Y 10/00 136/263 |
| 2007/0012955 | A1 | 1/2007 | Ihama |
| 2007/0063156 | A1 | 3/2007 | Hayashi |
| 2007/0090371 | A1 | 4/2007 | Drechsel et al. |
| 2010/0207112 | A1 | 8/2010 | Furst et al. |
| 2011/0012091 | A1 | 1/2011 | Forrest et al. |
| 2011/0074491 | A1 | 3/2011 | Yofu et al. |
| 2012/0126204 | A1 | 5/2012 | So et al. |
| 2012/0266958 | A1 | 10/2012 | Aksu et al. |
| 2012/0313088 | A1 | 12/2012 | Yofu et al. |
| 2013/0062595 | A1* | 3/2013 | Park ................... H01L 51/4253 257/40 |
| 2013/0087682 | A1 | 4/2013 | Nomura |
| 2013/0181202 | A1 | 7/2013 | Yofu et al. |
| 2014/0008619 | A1 | 1/2014 | Lee et al. |
| 2014/0054442 | A1 | 2/2014 | Huang et al. |
| 2014/0083496 | A1 | 3/2014 | Shibasaki et al. |
| 2014/0159752 | A1 | 6/2014 | Tsai et al. |
| 2014/0209173 | A1 | 7/2014 | Momose |
| 2014/0319509 | A1 | 10/2014 | Hattori et al. |
| 2015/0053942 | A1 | 2/2015 | Kho et al. |
| 2015/0060775 | A1 | 3/2015 | Liang et al. |
| 2015/0162548 | A1 | 6/2015 | Lim et al. |
| 2015/0228811 | A1 | 8/2015 | Hiroi et al. |
| 2015/0349073 | A1 | 12/2015 | Kang |
| 2016/0013248 | A1 | 1/2016 | Sawaki |
| 2016/0013424 | A1 | 1/2016 | Yamamoto et al. |
| 2016/0020258 | A1 | 1/2016 | Park et al. |
| 2016/0064672 | A1 | 3/2016 | Lee et al. |
| 2016/0099417 | A1 | 4/2016 | Sato et al. |
| 2016/0111561 | A1 | 4/2016 | Hsu et al. |
| 2016/0111651 | A1 | 4/2016 | Yun et al. |
| 2016/0126470 | A1 | 5/2016 | Ro et al. |
| 2016/0149132 | A1 | 5/2016 | Lim et al. |
| 2016/0197281 | A1 | 7/2016 | Momose et al. |
| 2016/0268401 | A1 | 9/2016 | Aleksov |
| 2017/0005142 | A1* | 1/2017 | Lee ..................... H01L 51/441 |
| 2017/0074652 | A1 | 3/2017 | Send et al. |
| 2017/0117424 | A1 | 4/2017 | Hiroi et al. |
| 2017/0294589 | A1 | 10/2017 | Shibuya et al. |
| 2018/0151624 | A1* | 5/2018 | Hasegawa ............ H01L 27/146 |

FOREIGN PATENT DOCUMENTS

| | | |
|---|---|---|
| EP | 0529162 A1 | 3/1993 |
| EP | 2317582 A1 | 5/2011 |
| EP | 30267722 | 6/2016 |
| JP | H09-311232 A | 12/1997 |
| JP | H10-91384 A | 4/1998 |
| JP | 2005-132914 A | 5/2005 |
| JP | 2006-261172 A | 9/2006 |
| JP | 2007-234650 A | 9/2007 |
| JP | 2009-274966 A | 11/2009 |
| JP | 2011-225544 A | 11/2011 |
| JP | 2011-253861 A | 12/2011 |
| JP | 2012-123292 A | 6/2012 |
| JP | 2012-151761 A | 8/2012 |
| JP | 2013-040147 A | 2/2013 |
| JP | 5323025 B2 | 10/2013 |
| JP | 2014-049559 A | 3/2014 |
| JP | 2014-210768 A | 11/2014 |
| JP | 2015/015415 A | 1/2015 |
| JP | 2015-043362 A | 3/2015 |
| JP | 2015-070060 A | 4/2015 |
| JP | 2015-092546 A | 5/2015 |
| KR | 10-2014-0106767 A | 9/2014 |
| KR | 2015/0066616 A | 6/2015 |
| KR | 10-2016-0009404 A | 1/2016 |
| KR | 10-2016-0024686 A | 3/2016 |
| KR | 10-2016-0052448 A | 5/2016 |
| KR | 10-2016-0062708 A | 6/2016 |
| WO | WO-2002-064600 A1 | 8/2002 |
| WO | WO-2008/091670 A2 | 7/2008 |
| WO | WO-2010/011658 A2 | 1/2010 |
| WO | WO-2010/038721 A1 | 4/2010 |
| WO | WO-2014/157238 A1 | 10/2014 |
| WO | WO-2014/169270 A2 | 10/2014 |

OTHER PUBLICATIONS

Satoshi Aihara et al. "Stacked Image Sensor With Green- and Red-Sensitive Organic Photoconductive Films Applying Zinc Oxide Thin-Film Transistors to a Signal Readout Circuit". IEEE Transactions on Electron Devices, vol. 56, No. 11. Nov. 2009. pp. 2570-2576.

Juha Alakarhu. "Image Sensors and Image Quality in Mobile Phones". International Image Sensor Workshop. 2007. pp. 1-4.

Drechsel J. et al: "Efficient organic solar cells based on a double p-i-n architecture using doped wide-gap transport layers", Applied Physics Letters, AIP Publishing LLC, US, vol. 86, No. 24, Jun. 7, 2005 (Jun. 7, 2005), pp. 244102-244102, XP012065900, ISSN: 0003-6951, DOI: 10.1063/1.1935771.

I.G. Hill et al., Organic Electronics, "Metal-dependent charge transfer and chemical interaction at interfaces between 3,4,9,10-perylenetetracarboxylic bisimidazole and gold, silver and magnesium", vol. 1, Issue 1, Dec. 2000, pp. 5-13.

Marzena Grucela-Zajac et al., "(Photo)physical Properties of New Molecular Glasses End-Capped with Thiophene Rings Composed of Diimide and Imine Units", The Journal of Physical Chemistry, May 21, 2014, pp. 13070-13086, ACS Author Choice.

Gorkem Memisoglu et al., "Highly Efficient Organic UV Photodetectors Based on Polyfluorene and Naphthalenediimide Blends: Effect of Thermal Annealing", 2012, International Journal of Photoenergy vol. 2012, Article ID 936075, 11 pages, Hindawi Publishing Corporation.

Jiří Mísek et al., "A Chiral and Colorful Redox Switch: Enhanced p Acidity in Action", 2010, Angew. Chem. Int. Ed. 2010, 49, 7680-7683, Wiley-VCH Verlag GmbH & Co. KGaA, Weinheim.

(56) References Cited

OTHER PUBLICATIONS

Ihama, et al. "CMOS Image Sensor with a Thin Overlaid Panchromatic Organic Photoconductive Layer for Sensors with Reduced Pixel Size," IDW'09, pp. 2123-2126.

Iwaoka, et al. "Possible roles of S O and S N interations in the functions and evolution of phospholipase $A_2$," Biophysics, vol. 2, pp. 23-34 (2006).

Iwaoka, et al. Studies on the Nonbonded Interactions of Divalent Organic Selenium, Department of Chemistry, School of Science, Tokai University, vol. 63, No. 9, pp. 63-72 (2005).

Jen, et al. "Synthesis and Characterization of Highly Efficient and Thermally Stable Diphenylamino-Substituted Thiophene Stilbene Chromophores for Nonlinear Optical Applications," Advanced Materials, . vol. 9, No. 2, pp. 132-135 (1997).

Lim, et al. "Organic-on-silicon complementary metal-oxide-semiconductor colour image sensors," Scientific Reports, vol. 5, pp. 1-7 (2014).

Singh, et al. "Radical Cations of Aromatic Selenium Compounds: Role of Se X Nonbonding Interations," The Journal of Physical Chemistry, vol. 117, pp. 9259-9265 (2013).

European Search Report dated Apr. 26, 2017 issued in corresponding European Application No. 16195944.0.

European Search Report for Application No. 17177002.7 dated Nov. 17, 2017.

European Search Report issued in corresponding European Patent Application No. 17150423.6-1555 dated Aug. 4, 2017.

European Search Report dated May 22, 2017 issued in European Application No. 17161078.5.

U.S. Notice of Allowance dated Dec. 20, 2017 issued in copending U.S. Appl. No. 15/609,125.

U.S. Office Action dated Jan. 5, 2018 issued in copending U.S. Appl. No. 15/362,964.

U.S. Office Action dated Jun. 1, 2018 issued in copending U.S. Appl. No. 15/362,964.

U.S. Office Action dated Jul. 3, 2017 issued in copending U.S. Appl. No. 15/255,649.

U.S. Office Action dated Jan. 29, 2018 issued in copending U.S. Appl. No. 15/255,649.

U.S. Office Action dated Feb. 14, 2018 issued in copending U.S. Appl. No. 15/272,580.

Final Office Action for U.S. Appl. No. 15/461,914 dated Aug. 24, 2018.

U.S. Office Action dated Jul. 25, 2018 issued in co-pending U.S. Appl. No. 15/272,580.

\* cited by examiner

ORGANIC PHOTOELECTRONIC DEVICE AND IMAGE SENSOR AND ELECTRONIC DEVICE

CROSS-REFERENCE TO RELATED APPLICATION

This application claims priority to and the benefit of Korean Patent Application No. 10-2016-0110234 filed in the Korean Intellectual Property Office on Aug. 29, 2016, the entire contents of which are incorporated herein by reference.

BACKGROUND

1. Field

Example embodiments relate to an organic photoelectronic device, an image sensor including the same, and an electronic device including the same.

2. Description of the Related Art

A photoelectronic device converts light into an electrical signal using photoelectronic effects, and may include a photodiode, a phototransistor, etc. The photoelectronic device may be applied to an image sensor, a solar cell, an organic light emitting diode, etc.

An image sensor including a photodiode requires relatively high resolution and thus a relatively small pixel. At present, a silicon photodiode is widely used, but the silicon photodiode has a problem of deteriorated sensitivity and has a relatively small absorption area due to relatively small pixels. Accordingly, an organic material that is capable of replacing silicon has been researched.

The organic material has a relatively high extinction coefficient and selectively absorbs light in a particular wavelength region depending on a molecular structure, and thus may simultaneously replace a photodiode and a color filter and resultantly improve sensitivity and contribute to higher integration.

However, the organic material may be different from silicon due to relatively high binding energy and a recombination behavior. Thus, an organic photoelectronic device including the organic material may show relatively low efficiency compared with a silicon-based photoelectronic device.

SUMMARY

Example embodiments provide an organic photoelectronic device capable of increasing wavelength selectivity and improving heat resistance.

Example embodiments also provide an image sensor including the organic photoelectronic device.

Example embodiments also provide an electronic device including the image sensor.

According to example embodiments, an organic photoelectronic device includes a first electrode and a second electrode facing each other, and first and second photoelectronic conversion layers between the first electrode and the second electrode, the first and second photoelectronic conversion layers including a p-type semiconductor and an n-type semiconductor, the first photoelectronic conversion layer having a first composition ratio ($p^1/n^1$) of the p-type semiconductor relative to the n-type semiconductor, the second photoelectronic conversion layer having a second composition ratio ($p^2/n^2$) of the p-type semiconductor relative to the n-type semiconductor, and $p^1/n^1 > p^2/n^2$.

The first composition ratio ($p^1/n^1$) may be greater than about 1.5 and less than about 3.5.

The first composition ratio ($p^1/n^1$) may be about 2.0 to about 3.0.

The second composition ratio ($p^2/n^2$) may be about 0.8 to about 1.2.

The second composition ratio ($p^2/n^2$) may be about 1.0.

The p-type semiconductor and the n-type semiconductor of the first photoelectronic conversion layer may be uniformly mixed at the first composition ratio ($p^1/n^1$) and the p-type semiconductor and the n-type semiconductor of the second photoelectronic conversion layer may be uniformly mixed at the second composition ratio ($p^2/n^2$).

At least one of the p-type semiconductor and the n-type semiconductor may be a light-absorbing material configured to selectively absorb one of red light, green light, and blue light.

One of the p-type semiconductor and the n-type semiconductor may be fullerene or a fullerene derivative.

One of the p-type semiconductor and the n-type semiconductor may be a light-absorbing material configured to selectively absorb green light having a maximum absorption wavelength in about 520 nm to about 580 nm and the other of the p-type semiconductor and the n-type semiconductor may be fullerene or a fullerene derivative.

The p-type semiconductor may be a light-absorbing material having a core structure including an electron donating moiety, a pi-conjugation linker, and an electron accepting moiety, and the n-type semiconductor may be fullerene or a fullerene derivative.

The p-type semiconductor may be a light-absorbing material represented by Chemical Formula 1.

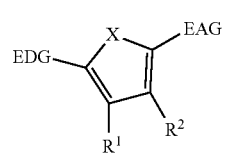

[Chemical Formula 1]

In Chemical Formula 1,

X is Se, Te, SO, $SO_2$, or $SiR^aR^b$,

EDG is an electron donating group,

EAG is an electron accepting group, and each of $R^1$, $R^2$, $R^a$, and $R^b$ are independently hydrogen or a monovalent substituent.

The p-type semiconductor may be a light-absorbing material represented by Chemical Formula 1A or 1B.

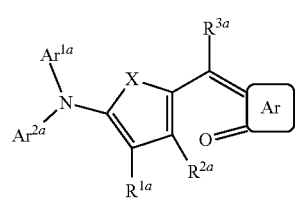

[Chemical Formula 1A]

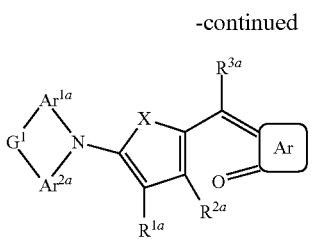

[Chemical Formula 1B]

In Chemical Formula 1A or 1B,

X is Se, Te, SO, SO$_2$, or SiR$^a$R$^b$,

Ar is a substituted or unsubstituted 5-membered ring, a substituted or unsubstituted 6-membered ring, or a fused ring of foregoing rings, each of Ar$^{1a}$ and Ar$^{2a}$ are independently a substituted or unsubstituted C$_6$ to C$_{30}$ aryl group or a substituted or unsubstituted C$_3$ to C$_{30}$ heteroaryl group, G$^1$ is one of a single bond, —(CR$^g$R$^h$)$_{n2}$—, —O—, —S—, —Se—, —N=, —NR$^i$—, —SiR$^j$R$^k$—, and —GeR$^l$R$^m$—, wherein n2 is 1 or 2, and each of R$^{1a}$ to R$^{3a}$, R$^a$, R$^b$, and R$^g$ to R$^m$ are independently hydrogen, a substituted or unsubstituted C$_1$ to C$_{30}$ alkyl group, a substituted or unsubstituted C$_6$ to C$_{30}$ aryl group, a substituted or unsubstituted C$_3$ to C$_{30}$ heteroaryl group, a substituted or unsubstituted C$_1$ to C$_6$ alkoxy group, a halogen, or a cyano group.

The second photoelectronic conversion layer may be closer to a light receiving side than the first photoelectronic conversion layer.

The first photoelectronic conversion layer may be thicker than the second photoelectronic conversion layer.

The first photoelectronic conversion layer may have a thickness of about 5 nm to about 300 nm and the second photoelectronic conversion layer may have a thickness of about 2 nm to about 40 nm.

The first photoelectronic conversion layer and the second photoelectronic conversion layer may contact each other.

The first electrode may be an anode and the second electrode may be a cathode, the first photoelectronic conversion layer may be closer to the first electrode than the second photoelectronic conversion layer, and the second photoelectronic conversion layer may be closer to the second electrode than the first photoelectronic conversion layer.

According to example embodiments, an organic photoelectronic device includes a first electrode, a first photoelectronic conversion layer on the first electrode, the first photoelectronic conversion layer including a p-type semiconductor and an n-type semiconductor at a first composition ratio (p$^1$/n$^1$), the first composition ratio (p$^1$/n$^1$) being greater than about 1.5 and less than about 3.5, and a second photoelectronic conversion layer on the first photoelectronic conversion layer, the second photoelectronic conversion layer including the p-type semiconductor and the n-type semiconductor at a second composition ratio (p$^2$/n$^2$), the second composition ratio (p$^2$/n$^2$) being about 0.8 to about 1.2.

According to example embodiments, an image sensor includes the organic photoelectronic device.

According to example embodiments, an image sensor includes a semiconductor substrate integrated with at least one first photo-sensing device and at least one second photo-sensing device, the first photo-sensing device configured to sense light in a blue wavelength region and the second photo-sensing device configured to sense light in a red wavelength region, and at least one third photo-sensing device on the semiconductor substrate, the third photo-sensing device configured to selectively absorb light in a green wavelength region, the third photo-sensing device including the organic photoelectronic device of example embodiments.

According to example embodiments, an electronic device includes the image sensor. The electronic device may be a mobile phone or a digital camera.

According to example embodiments, an organic photoelectronic device includes a first electrode and a second electrode facing each other, and first and second photoelectronic conversion layers between the first electrode and the second electrode, each of the first and second photoelectronic conversion layers including a p-type semiconductor and an n-type semiconductor in a composition ratio (p/n), the composition ratio (p/n) of one of the first and second photoelectronic conversion layers where p>n.

The composition ratio (p/n) of the one of the first and second photoelectronic conversion layers may be greater than about 1.5 and less than about 3.5.

The composition ratio (p/n) of the other of the first and second photoelectronic conversion layers may be about 0.8 to about 1.2.

The organic photoelectronic device has higher wavelength selectivity and improved heat resistance.

DETAILED DESCRIPTION

Figure 1:
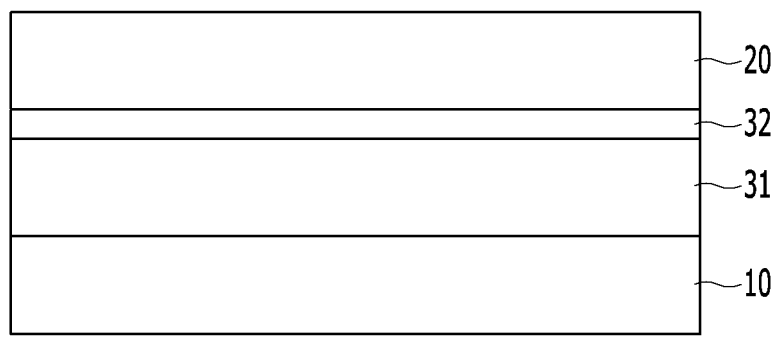
FIG. 1 is a cross-sectional view showing an organic photoelectronic device according to example embodiments.

One or more example embodiments will be described in detail with reference to the accompanying drawings.

Example embodiments, however, may be embodied in various different forms, and should not be construed as being limited to only the illustrated embodiments. Rather, the illustrated embodiments are provided as examples so that this disclosure will be thorough and complete, and will fully convey the concepts of this disclosure to those skilled in the art. Accordingly, known processes, elements, and techniques, may not be described with respect to some example embodiments. Unless otherwise noted, like reference characters denote like elements throughout the attached drawings and written description, and thus descriptions will not be repeated.

Although the terms "first," "second," "third," etc., may be used herein to describe various elements, components, regions, layers, and/or sections, these elements, components, regions, layers, and/or sections, should not be limited by these terms. These terms are only used to distinguish one element, component, region, layer, or section, from another region, layer, or section. Thus, a first element, component, region, layer, or section, discussed below may be termed a second element, component, region, layer, or section, without departing from the scope of this disclosure.

Spatially relative terms, such as "beneath," "below," "lower," "under," "above," "upper," etc., may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below," "beneath," or "under," other elements or features would then be oriented "above" the other elements or features. Thus, the example terms "below" and "under" may encompass both an orientation of above and below. The device may be otherwise oriented (rotated 90 degrees or at other orientations) and the spatially relative descriptors used herein interpreted accordingly. In addition, when an element is referred to as being "between" two elements, the element may be the only element between the two elements, or one or more other intervening elements may be present.

As used herein, the singular forms "a," "an," and "the," are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups, thereof. As used herein, the term "and/or" includes any and all combinations of one or more of the associated listed items. Expressions such as "at least one of," when preceding a list of elements, modify the entire list of elements and do not modify the individual elements of the list. Also, the term "exemplary" is intended to refer to an example or illustration.

When an element is referred to as being "on," "connected to," "coupled to," or "adjacent to," another element, the element may be directly on, connected to, coupled to, or adjacent to, the other element, or one or more other intervening elements may be present. In contrast, when an element is referred to as being "directly on," "directly connected to," "directly coupled to," or "immediately adjacent to," another element, there are no intervening elements present.

Unless otherwise defined, all terms (including technical and scientific terms) used herein have the same meaning as commonly understood by one of ordinary skill in the art to which example embodiments belong. Terms, such as those defined in commonly used dictionaries, should be interpreted as having a meaning that is consistent with their meaning in the context of the relevant art and/or this disclosure, and should not be interpreted in an idealized or overly formal sense unless expressly so defined herein.

Example embodiments may be described with reference to acts and symbolic representations of operations (e.g., in the form of flow charts, flow diagrams, data flow diagrams, structure diagrams, block diagrams, etc.) that may be implemented in conjunction with units and/or devices discussed in more detail below. Although discussed in a particularly manner, a function or operation specified in a specific block may be performed differently from the flow specified in a flowchart, flow diagram, etc. For example, functions or operations illustrated as being performed serially in two consecutive blocks may actually be performed simultaneously, or in some cases be performed in reverse order.

Units and/or devices according to one or more example embodiments may be implemented using hardware, software, and/or a combination thereof. For example, hardware devices may be implemented using processing circuitry such as, but not limited to, a processor, Central Processing Unit (CPU), a controller, an arithmetic logic unit (ALU), a digital signal processor, a microcomputer, a field programmable gate array (FPGA), a System-on-Chip (SoC), an application-specific integrated circuit (ASIC), a programmable logic unit, a microprocessor, or any other device capable of responding to and executing instructions in a defined manner.

Software may include a computer program, program code, instructions, or some combination thereof, for independently or collectively instructing or configuring a hardware device to operate as desired. The computer program and/or program code may include program or computer-readable instructions, software components, software modules, data files, data structures, and/or the like, capable of being implemented by one or more hardware devices, such as one or more of the hardware devices mentioned above. Examples of program code include both machine code produced by a compiler and higher level program code that is executed using an interpreter.

For example, when a hardware device is a computer processing device (e.g., a processor, Central Processing Unit (CPU), a controller, an arithmetic logic unit (ALU), a digital signal processor, a microcomputer, a microprocessor, etc.), the computer processing device may be configured to carry out program code by performing arithmetical, logical, and input/output operations, according to the program code. Once the program code is loaded into a computer processing device, the computer processing device may be programmed to perform the program code, thereby transforming the computer processing device into a special purpose computer processing device. In a more specific example, when the program code is loaded into a processor, the processor becomes programmed to perform the program code and operations corresponding thereto, thereby transforming the processor into a special purpose processor.

Software and/or data may be embodied permanently or temporarily in any type of machine, component, physical or virtual equipment, or computer storage medium or device, capable of providing instructions or data to, or being interpreted by, a hardware device. The software also may be distributed over network coupled computer systems so that the software is stored and executed in a distributed fashion. In particular, for example, software and data may be stored by one or more computer readable recording mediums, including the tangible or non-transitory computer-readable storage media discussed herein.

According to one or more example embodiments, computer processing devices may be described as including various functional units that perform various operations and/or functions to increase the clarity of the description. However, computer processing devices are not intended to be limited to these functional units. For example, in one or more example embodiments, the various operations and/or functions of the functional units may be performed by other ones of the functional units. Further, the computer processing devices may perform the operations and/or functions of the various functional units without sub-dividing the operations and/or functions of the computer processing units into these various functional units.

Units and/or devices according to one or more example embodiments may also include one or more storage devices. The one or more storage devices may be tangible or non-transitory computer-readable storage media, such as random access memory (RAM), read only memory (ROM), a permanent mass storage device (such as a disk drive), solid state (e.g., NAND flash) device, and/or any other like data storage mechanism capable of storing and recording data. The one or more storage devices may be configured to store computer programs, program code, instructions, or some combination thereof, for one or more operating systems and/or for implementing the example embodiments described herein. The computer programs, program code, instructions, or some combination thereof, may also be loaded from a separate computer readable storage medium into the one or more storage devices and/or one or more computer processing devices using a drive mechanism. Such separate computer readable storage medium may include a Universal Serial Bus (USB) flash drive, a memory stick, a Blu-ray/DVD/CD-ROM drive, a memory card, and/or other like computer readable storage media. The computer programs, program code, instructions, or some combination thereof, may be loaded into the one or more storage devices and/or the one or more computer processing devices from a remote data storage device via a network interface, rather than via a local computer readable storage medium. Additionally, the computer programs, program code, instructions, or some combination thereof, may be loaded into the one or more storage devices and/or the one or more processors from a remote computing system that is configured to transfer and/or distribute the computer programs, program code, instructions, or some combination thereof, over a network. The remote computing system may transfer and/or distribute the computer programs, program code, instructions, or some combination thereof, via a wired interface, an air interface, and/or any other like medium.

The one or more hardware devices, the one or more storage devices, and/or the computer programs, program code, instructions, or some combination thereof, may be specially designed and constructed for the purposes of the example embodiments, or they may be known devices that are altered and/or modified for the purposes of example embodiments.

A hardware device, such as a computer processing device, may run an operating system (OS) and one or more software applications that run on the OS. The computer processing device also may access, store, manipulate, process, and create data in response to execution of the software. For simplicity, one or more example embodiments may be exemplified as one computer processing device; however, one skilled in the art will appreciate that a hardware device may include multiple processing elements and multiple types of processing elements. For example, a hardware device may include multiple processors or a processor and a controller. In addition, other processing configurations are possible, such as parallel processors.

Although described with reference to specific examples and drawings, modifications, additions and substitutions of example embodiments may be variously made according to the description by those of ordinary skill in the art. For example, the described techniques may be performed in an order different with that of the methods described, and/or components such as the described system, architecture, devices, circuit, etc., may be connected or combined to be different from the above-described methods, or results may be appropriately achieved by other components or equivalents.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Hereinafter, 'combination' refers to a mixture of two or more and a stack structure of two or more.

As used herein, when a definition is not otherwise provided, the term "substituted" may refer to replacement of hydrogen of a compound by a substituent selected from a halogen atom, a hydroxy group, an alkoxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid or a salt thereof, a $C_1$ to $C_{20}$ alkyl group, a $C_2$ to $C_{20}$ alkenyl group, a $C_2$ to $C_{20}$ alkynyl group, a $C_6$ to $C_{30}$ aryl group, a $C_7$ to $C_{30}$ arylalkyl group, a $C_1$ to $C_{30}$ alkoxy group, a $C_1$ to $C_{20}$ heteroalkyl group, a $C_3$ to $C_{20}$ heteroarylalkyl group, a $C_3$ to $C_{30}$ cycloalkyl group, a $C_3$ to $C_{15}$ cycloalkenyl group, a $C_6$ to $C_{15}$ cycloalkynyl group, a $C_3$ to $C_{30}$ heterocycloalkyl group, and a combination thereof.

Hereinafter, an organic photoelectronic device according to example embodiments is described referring to drawings.

FIG. 1 is a cross-sectional view showing an organic photoelectronic device according to example embodiments.

Referring to FIG. 1, an organic photoelectronic device 100 according to example embodiments includes a first electrode 10 and a second electrode 20 facing each other and first and second photoelectronic conversion layers 31 and 32 between the first electrode 10 and the second electrode 20.

A substrate (not shown) may be disposed on a surface of the first electrode 10 and a surface of the second electrode 20. The substrate may at least partially comprise, for example, an inorganic material including glass, an organic material including polycarbonate, polymethylmethacrylate, polyethyleneterephthalate, polyethylenenaphthalate, polyamide, polyethersulfone, or a combination thereof, or a silicon wafer.

One of the first electrode 10 and the second electrode 20 is an anode and the other is a cathode. For example, the first electrode 10 may be an anode and the second electrode 20 may be a cathode.

At least one of the first electrode 10 and the second electrode 20 may be a light-transmitting electrode, and the light-transmitting electrode may at least partially comprise, for example, a conductive oxide including indium tin oxide (ITO) or indium zinc oxide (IZO), zinc oxide (ZnO), tin oxide (SnO), aluminum tin oxide (AlTO), and fluorine doped tin oxide (FTO), or a metal thin layer of a thin monolayer or multilayer. When one of the first electrode 10 and the second electrode 20 is a non-light-transmitting electrode, the non-light-transmitting electrode may at least partially comprise, for example, an opaque conductor including aluminum (Al), silver (Ag), or gold (Au). For example, the first electrode 10 and the second electrode 20 are light-transmitting electrodes. For example, the second electrode 20 may be a light receiving electrode disposed at a light receiving side.

Each of the first and second photoelectronic conversion layers 31 and 32 includes a p-type semiconductor and an n-type semiconductor to form a pn junction, and absorbs external light to generate excitons and then separates the generated excitons into holes and electrons. For example, the p-type semiconductor of the first photoelectronic conversion layer 31 may be the same as or different from the p-type semiconductor of the second photoelectronic conversion layer 32. For example, the n-type semiconductor of the first photoelectronic conversion layer 31 may be the same as or different from the n-type semiconductor of the second photoelectronic conversion layer 32.

The first and second photoelectronic conversion layers 31 and 32 may absorb light in at least one part of a wavelength region of a visible ray wavelength region, and may selectively absorb, for example a part of green light, blue light, and red light.

The p-type semiconductor and the n-type semiconductor of the first and second photoelectronic conversion layers 31 and 32 may be light-absorbing materials, for example a light-absorbing material absorbing light in a visible ray wavelength region. At least one of the p-type semiconductor and the n-type semiconductor of the first and second photoelectronic conversion layers 31 and 32 may be organic materials.

At least one of the p-type semiconductor and the n-type semiconductor of the first and second photoelectronic conversion layers 31 and 32 may be light-absorbing materials that selectively absorb one of green light, blue light, and red light. For example, one of the p-type semiconductor and the n-type semiconductor of the first and second photoelectronic conversion layers 31 and 32 may be a light-absorbing material that selectively absorbs one of green light, blue light, and red light. For example, the p-type semiconductor of the first and second photoelectronic conversion layers 31 and 32 may be a light-absorbing material that selectively absorbs one of green light, blue light, and red light and the n-type semiconductor may be fullerene or a fullerene derivative. For example, one of the p-type semiconductor and the n-type semiconductor of the first and second photoelectronic conversion layers 31 and 32 may be a light-absorbing material that selectively absorbs green light having a maximum absorption wavelength in about 520 nm to about 580 nm and the other of the p-type semiconductor and the n-type semiconductor may be fullerene or a fullerene derivative. For example, the p-type semiconductor of the first and second photoelectronic conversion layers 31 and 32 may be a light-absorbing material that selectively absorbs green light having a maximum absorption wavelength in about 520 nm to about 580 nm and the n-type semiconductor may be fullerene or a fullerene derivative.

For example, one of the p-type semiconductor and the n-type semiconductor of the first and second photoelectronic conversion layers 31 and 32 may be a light-absorbing material having an energy bandgap of about 1.7 eV to about 2.3 eV. When it has an energy bandgap within the ranges, it may selectively absorb light in a green wavelength region having a maximum absorption wavelength ($\lambda_{max}$) in about 520 nm to 580 nm and has high external quantum efficiency (EQE) and thus improves photoelectronic conversion efficiency. For example, one of the p-type semiconductor and the n-type semiconductor of the first and second photoelectronic conversion layers 31 and 32 may be a light-absorbing material having an energy bandgap of about 1.8 eV to about 2.2 eV, for example about 1.9 eV to about 2.1 eV.

For example, the p-type semiconductor of the first and second photoelectronic conversion layers 31 and 32 may be a light-absorbing material having an energy bandgap of about 1.7 eV to about 2.3 eV. For example, the p-type semiconductor of the first and second photoelectronic conversion layers 31 and 32 may be a light-absorbing material having an energy bandgap of about 1.7 eV to about 2.3 eV and the n-type semiconductor may be fullerene or a fullerene derivative.

For example, the p-type semiconductor may have a core structure including an electron donating moiety, a pi-conjugation linker, and an electron accepting moiety. Herein, the electron donating moiety is a moiety that donates electrons and forms holes when it receives light and the electron accepting moiety is a moiety that accepts electrons when it receives light.

The first and second photoelectronic conversion layers 31 and 32 may respectively be an intrinsic layer (I layer) that includes the p-type semiconductor and the n-type semiconductor blended in a form of a bulk heterojunction. For example, the p-type semiconductor and the n-type semiconductor of the first photoelectronic conversion layer 31 may be uniformly blended at the same composition ratio along a thickness direction of the first photoelectronic conversion layer 31. For example, the p-type semiconductor and the n-type semiconductor of the second photoelectronic conversion layer 32 may be uniformly blended at the same composition ratio along a thickness direction of the second photoelectronic conversion layer 32. The first and second photoelectronic conversion layers 31 and 32 may be, for example in contact with each other.

The first and second photoelectronic conversion layers 31 and 32 may have a different mixing ratio of the p-type semiconductor and the n-type semiconductor, that is to say a composition of the p-type semiconductor and the n-type semiconductor. Herein the composition of the p-type semiconductor and the n-type semiconductor may be defined as a volume of the p-type semiconductor relative to a volume of the n-type semiconductor, and may be represented by p/n.

For example, the first composition ratio ($p^1/n^1$) of the p-type semiconductor relative to the n-type semiconductor of the first photoelectronic conversion layer 31 may be greater than the second composition ratio ($p^2/n^2$) of the p-type semiconductor relative to the n-type semiconductor of the second photoelectronic conversion layer.

The first photoelectronic conversion layer 31 may be a p-type rich layer where the p-type semiconductor is included in a larger amount than the n-type semiconductor, and for example the first composition ratio ($p^1/n^1$) of the p-type semiconductor relative to the n-type semiconductor of the first photoelectronic conversion layer 31 may be greater than about 1.0. For example, the first composition ratio ($p^1/n^1$) of the p-type semiconductor relative to the n-type semiconductor of the first photoelectronic conversion layer 31 may be greater than about 1.0 and less than or equal to about 10.0, for example about 1.2 to about 5.0, for example about 1.5 to about 3.5, for example greater than about 1.5 and less than about 3.5, for example about 2.0 to about 3.0.

The second composition ratio ($p^2/n^2$) of the p-type semiconductor relative to the n-type semiconductor of the second photoelectronic conversion layer 32 may be less than the first composition ratio ($p^1/n^1$) of the first photoelectronic conversion layer 31. Within the ranges, for example the second composition ratio ($p^2/n^2$) of the p-type semiconductor relative to the n-type semiconductor of the second photoelectronic conversion layer 32 may be about 0.5 to about 1.5, for example about 0.7 to about 1.3, for example about 0.8 to about 1.2, for example about 1.0.

For example the first composition ratio ($p^1/n^1$) of the p-type semiconductor relative to the n-type semiconductor of the first photoelectronic conversion layer 31 may be greater than about 1.5 and less than about 3.5 and the second composition ratio ($p^2/n^2$) of the p-type semiconductor relative to the n-type semiconductor of the second photoelectronic conversion layer 32 may be about 0.8 to about 1.2.

For example, the first composition ratio ($p^1/n^1$) of the p-type semiconductor relative to the n-type semiconductor of the first photoelectronic conversion layer 31 may be greater than about 1.5 and less than about 3.5 and the second composition ratio ($p^2/n^2$) of the p-type semiconductor relative to the n-type semiconductor of the second photoelectronic conversion layer 32 may be about 1.0.

For example, the first composition ratio ($p^1/n^1$) of the p-type semiconductor relative to the n-type semiconductor of the first photoelectronic conversion layer may be about 2.0 to about 3.0 and the second composition ratio ($p^2/n^2$) of the p-type semiconductor relative to the n-type semiconductor of the second photoelectronic conversion layer 32 may be about 0.8 to about 1.2.

For example the first composition ratio ($p^1/n^1$) of the p-type semiconductor relative to the n-type semiconductor of the first photoelectronic conversion layer 31 may be about 2.0 to about 3.0 and the second composition ratio ($p^2/n^2$) of the p-type semiconductor relative to the n-type semiconductor of the second photoelectronic conversion layer 32 may be about 1.0.

The first photoelectronic conversion layer 31 may be thicker than the second photoelectronic conversion layer 32. The first photoelectronic conversion layer 31 may have a thickness, for example about 5 nm to about 300 nm and the second photoelectronic conversion layer 32 may have a thickness, for example about 2 nm to about 40 nm.

When the p-type semiconductor is, for example a light-absorbing material that selectively absorbs one of red light, green light, and blue light and the n-type semiconductor is, for example fullerene or a fullerene derivative, the first photoelectronic conversion layer 31 is included in a relatively larger amount than the p-type semiconductor and thereby light absorption in a given or predetermined wavelength region may be increased and thus external quantum efficiency (EQE) in a given or predetermined wavelength region may be increased. Accordingly, wavelength selectivity of the organic photoelectronic device 100 may be increased.

When the p-type semiconductor is for example a light-absorbing material that selectively absorbs green light having a maximum absorption wavelength ($\lambda_{max}$) in about 520 nm to about 580 nm and the n-type semiconductor is for example fullerene or a fullerene derivative, the first photoelectronic conversion layer 31 includes the p-type semiconductor in a relatively larger amount, and thereby light absorption in a green wavelength region may be increased, and thus, external quantum efficiency (EQE) in a green wavelength region may be increased. Accordingly, wavelength selectivity of the organic photoelectronic device 100 may be increased.

On the other hand, the second photoelectronic conversion layer 32 is formed to be relatively thin on the first photoelectronic conversion layer 31 and thus may accessorily perform a light absorption and a photoelectronic conversion and simultaneously, includes an n-type semiconductor including fullerene or a fullerene derivative in a more amount than the first photoelectronic conversion layer 31 and thus may reduce or prevent heat resistance deterioration of the organic photoelectronic device 100. Accordingly, the organic photoelectronic device 100 may be suppressed or prevented from thermal degradation during the subsequent process or the operation.

For example, the first photoelectronic conversion layer 31 may be a main photoelectronic conversion layer selectively absorbing light in a given or predetermined wavelength region and photoelectronically converting it, while the second photoelectronic conversion layer 32 may be an auxiliary photoelectronic conversion layer improving heat resistance as well as accessorily increasing the photoelectronic conversion of the first photoelectronic conversion layer 31.

As described above, at least one of the p-type semiconductor and the n-type semiconductor of the first and second photoelectronic conversion layers 31 and 32 may be an organic material, and for example, the p-type semiconductor may be an organic material.

As described above, the p-type semiconductor may be an organic material having a core structure, for example including an electron donating moiety, a pi-conjugation linker, and an electron accepting moiety.

The p-type semiconductor may be, for example a light-absorbing material represented by Chemical Formula 1, but is not limited thereto.

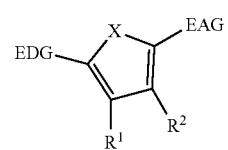

[Chemical Formula 1]

In Chemical Formula 1,

X is Se, Te, SO, $SO_2$, or $SiR^aR^b$,

EDG is an electron donating group,

EAG is an electron accepting group, and $R^1$, $R^2$, $R^a$, and $R^b$ are independently hydrogen or a monovalent substituent.

The p-type semiconductor may be, for example a light-absorbing material represented by Chemical Formula 1A or 1B, but is not limited thereto.

[Chemical Formula 1A]

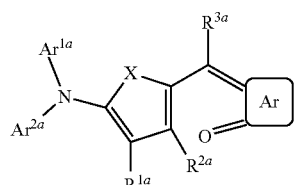

[Chemical Formula 1B]

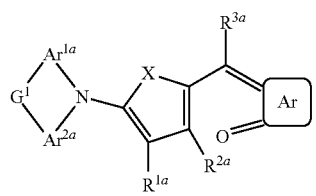

In Chemical Formula 1A or 1B,

X is Se, Te, SO, $SO_2$, or $SiR^aR^b$,

Ar is a substituted or unsubstituted 5-membered ring, a substituted or unsubstituted 6-membered ring, or a fused ring of foregoing rings, each of $Ar^{1a}$ and $Ar^{2a}$ are independently a substituted or unsubstituted $C_6$ to $C_{30}$ aryl group or a substituted or unsubstituted $C_3$ to $C_{30}$ heteroaryl group, $G^1$ is one of a single bond, $-(CR^gR^h)_{n2}-$, $-O-$, $-S-$, $-Se-$, $-N=$, $-NR^j-$, $-SiR^jR^k-$, and $-GeR^lR^m-$, wherein n2 is 1 or 2, and each of $R^{1a}$ to $R^{3a}$, $R^a$, $R^b$, and $R^g$ to $R^m$ are independently hydrogen, a substituted or unsubstituted $C_1$ to $C_{30}$ alkyl group, a substituted or unsubstituted $C_6$ to $C_{30}$ aryl group, a substituted or unsubstituted $C_3$ to $C_{30}$ heteroaryl group, a substituted or unsubstituted $C_1$ to $C_6$ alkoxy group, a halogen, or a cyano group.

The p-type semiconductor may be, for example a light-absorbing material represented by one of Chemical Formulae 1A-1 to 1A-4, but is not limited thereto.

[Chemical Formula 1A-1]

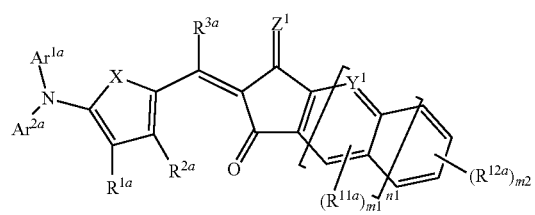

[Chemical Formula 1A-2]

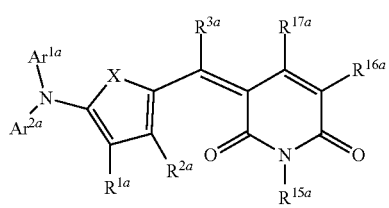

[Chemical Formula 1A-3]

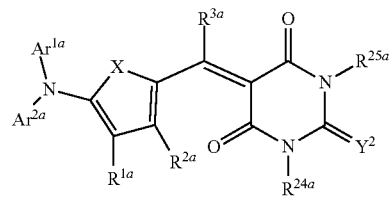

[Chemical Formula 1A-4]

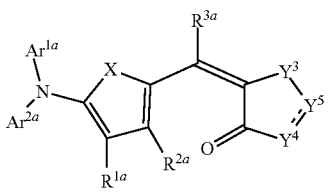

In Chemical Formulae 1A-1 to 1A-4,

X is Se, Te, SO, $SO_2$, or $SiR^aR^b$, $Z^1$ is O or $CR^cR^d$, $Y^1$ is N or $CR^e$, $Y^2$ is one of O, S, Se, Te, and $C(R^f)(CN)$, $Y^3$ is O, S, Se, or Te, $Y^4$ is N or $NR^{18a}$, $Y^5$ is $CR^{19a}$ or $C=CR^{20a}(CN)$, each of $Ar^{1a}$ and $Ar^{2a}$ are independently a substituted or unsubstituted $C_6$ to $C_{30}$ aryl group or a substituted or unsubstituted $C_3$ to $C_{30}$ heteroaryl group, each of $R^{1a}$ to $R^{3a}$, $R^{11a}$, $R^{12a}$, $R^{15a}$ to $R^{20a}$, $R^{24a}$, $R^{25a}$, and $R^a$ to $R^f$ are independently hydrogen, a substituted or unsubstituted $C_1$ to $C_{30}$ alkyl group, a substituted or unsubstituted $C_6$ to $C_{30}$ aryl group, a substituted or unsubstituted $C_3$ to $C_{30}$ heteroaryl group, a substituted or unsubstituted $C_1$ to $C_6$ alkoxy group, a halogen, or a cyano group, n1 is 0 or 1, m1 is 0 or 1, and m2 is an integer ranging from 0 to 4.

The light-absorbing material represented by one of Chemical Formulae 1A-1 to 1A-4 may be, for example compounds of Group 1, but is not limited thereto.

[Group 1]

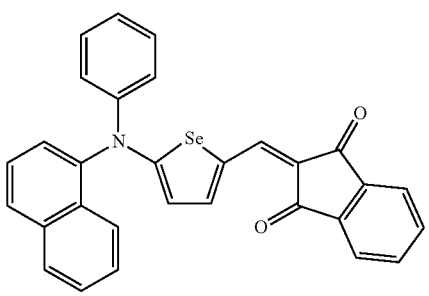

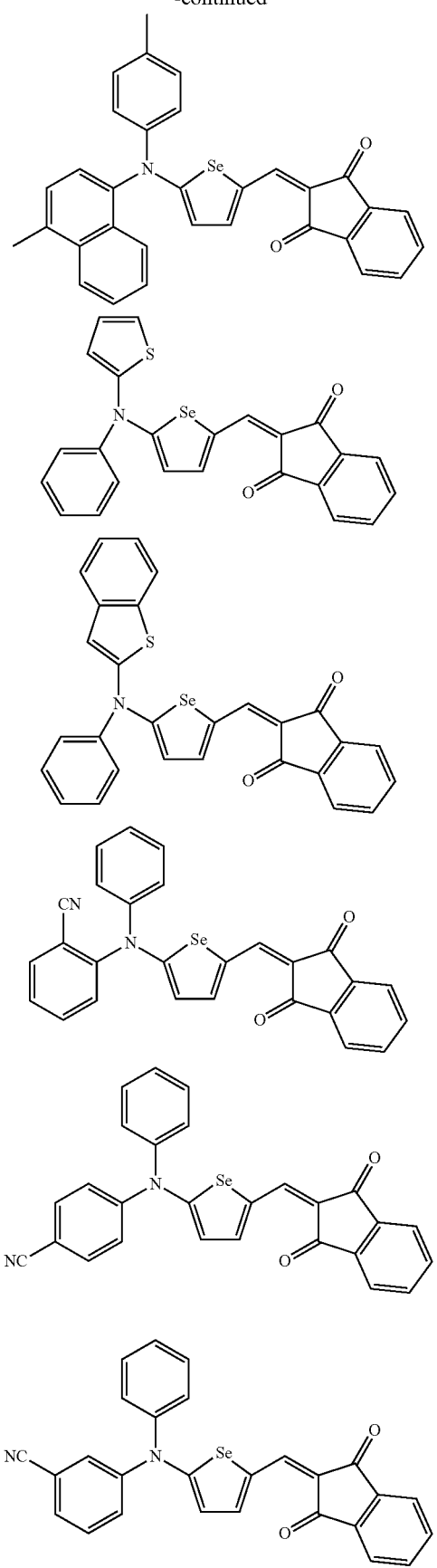
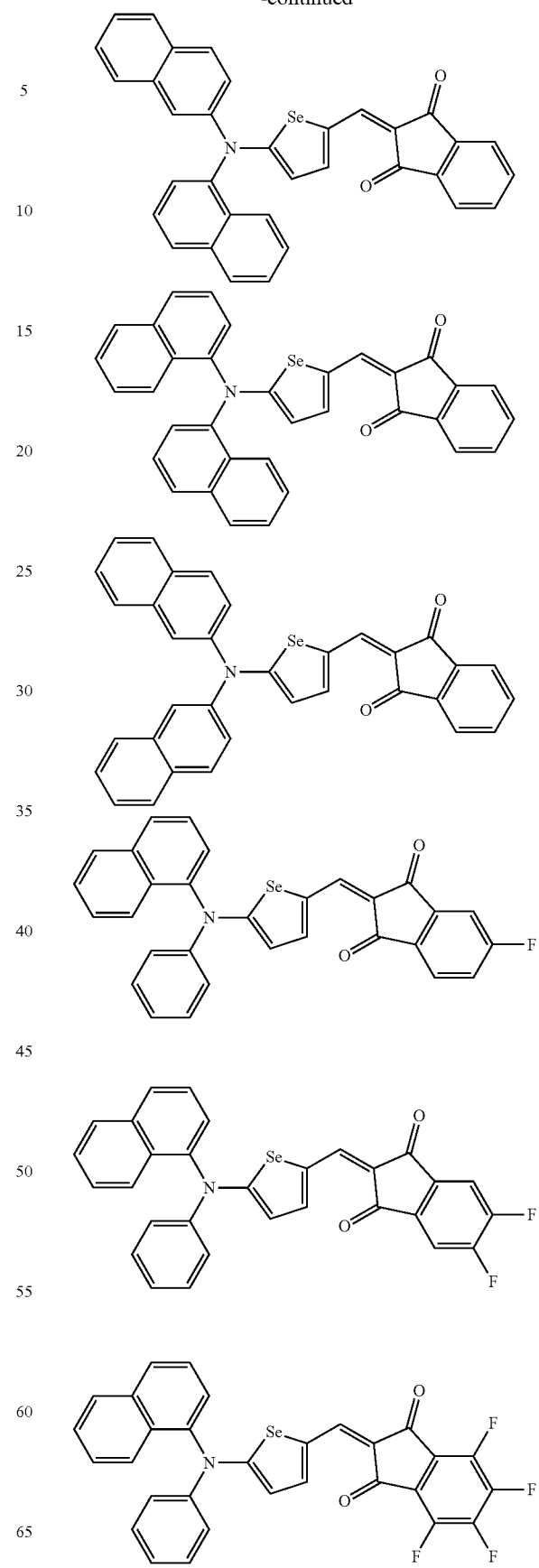

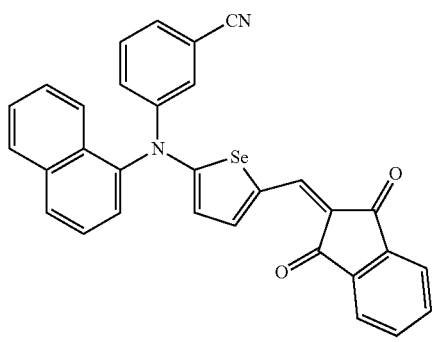
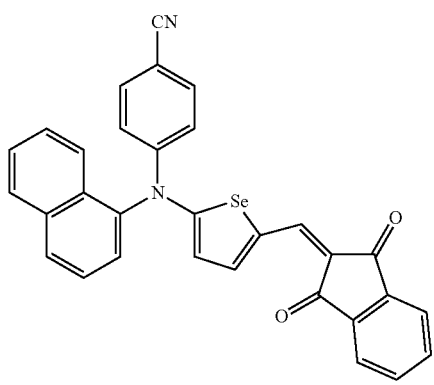
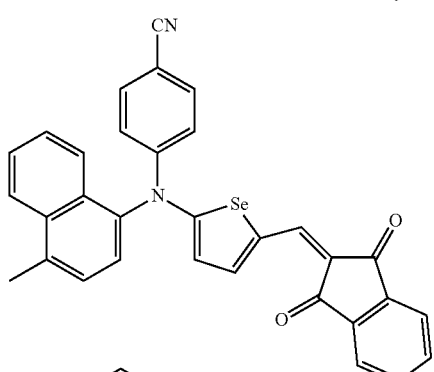
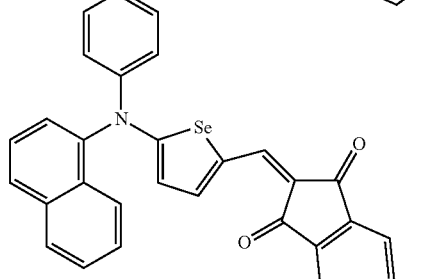
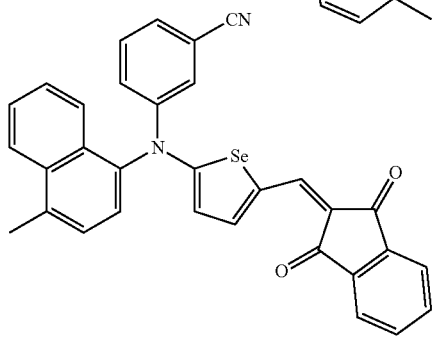
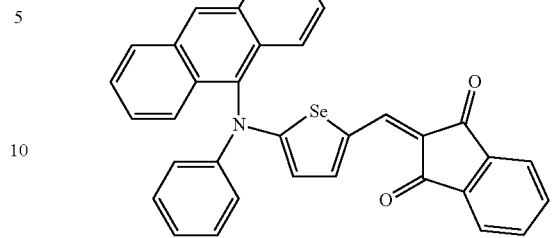
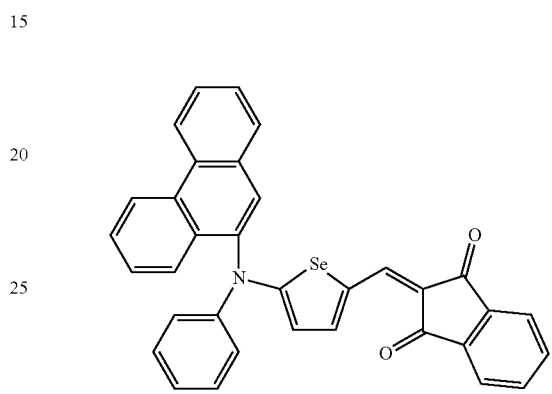
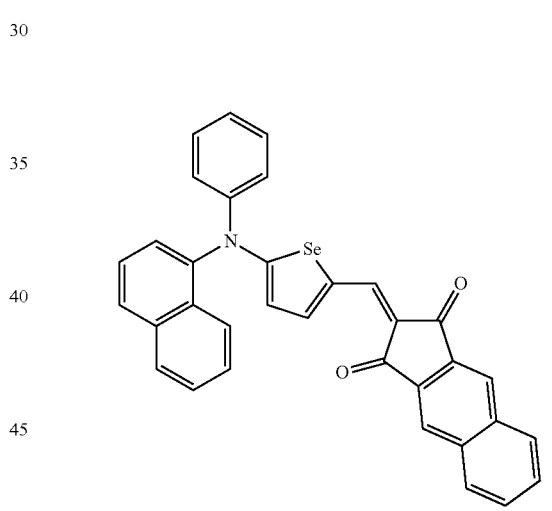
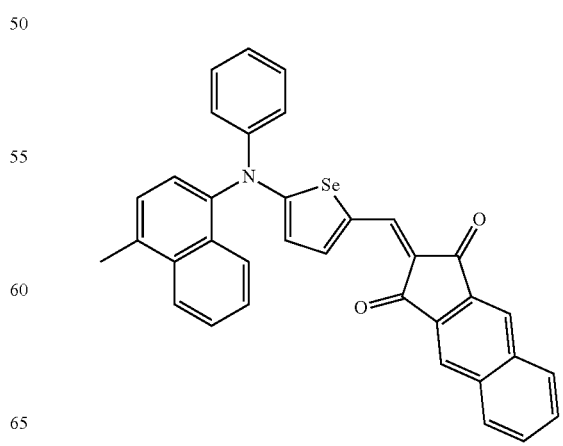

-continued
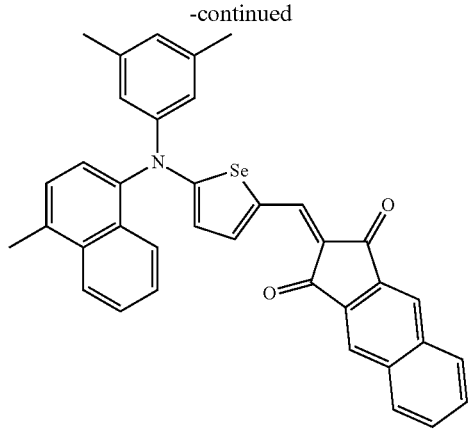
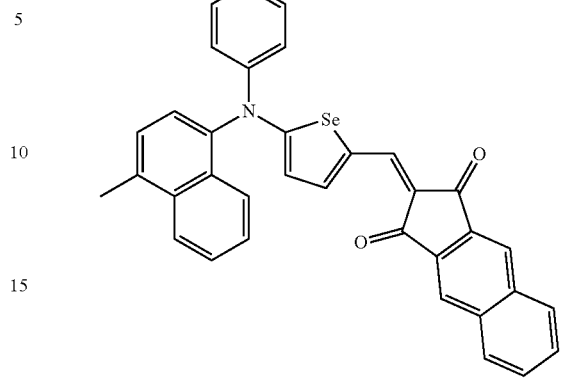
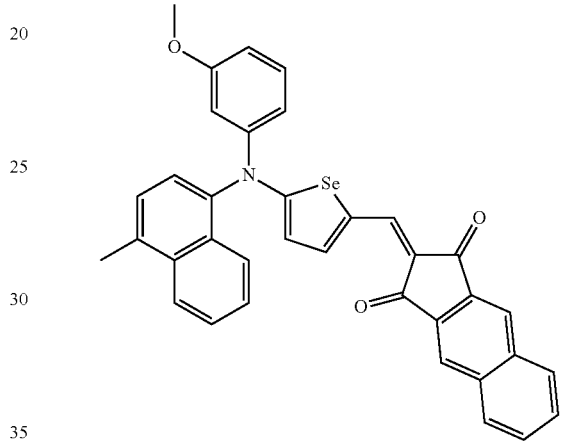
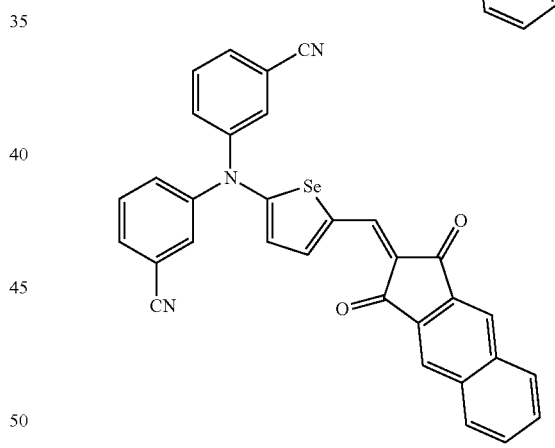
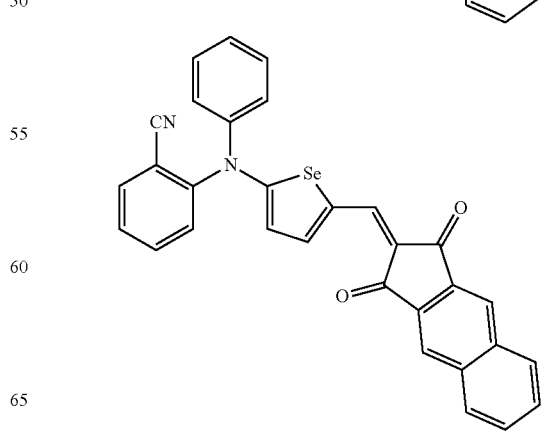

-continued
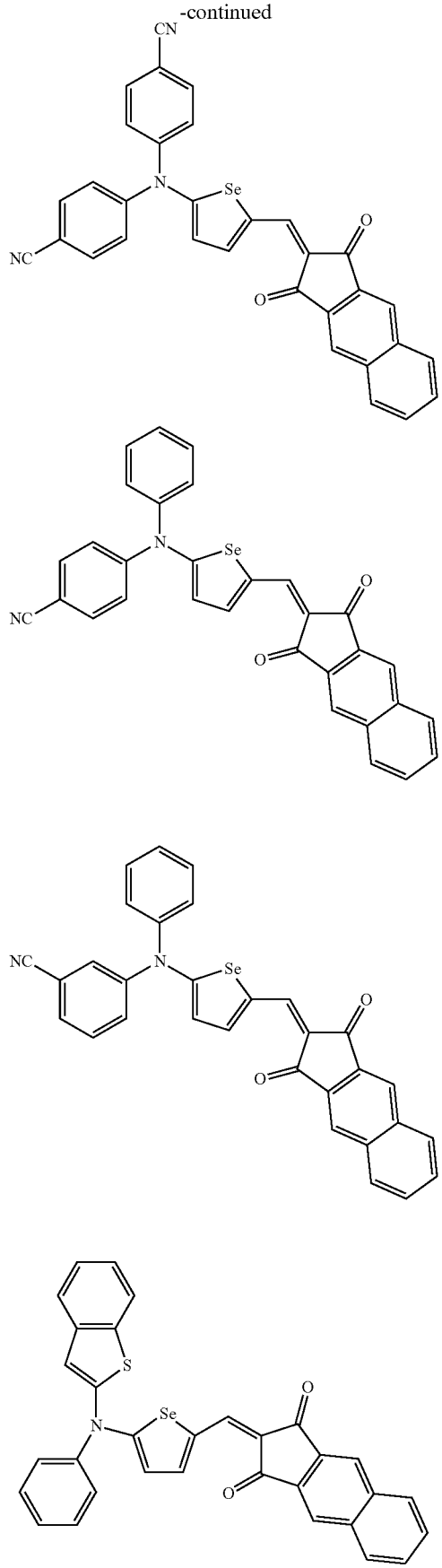
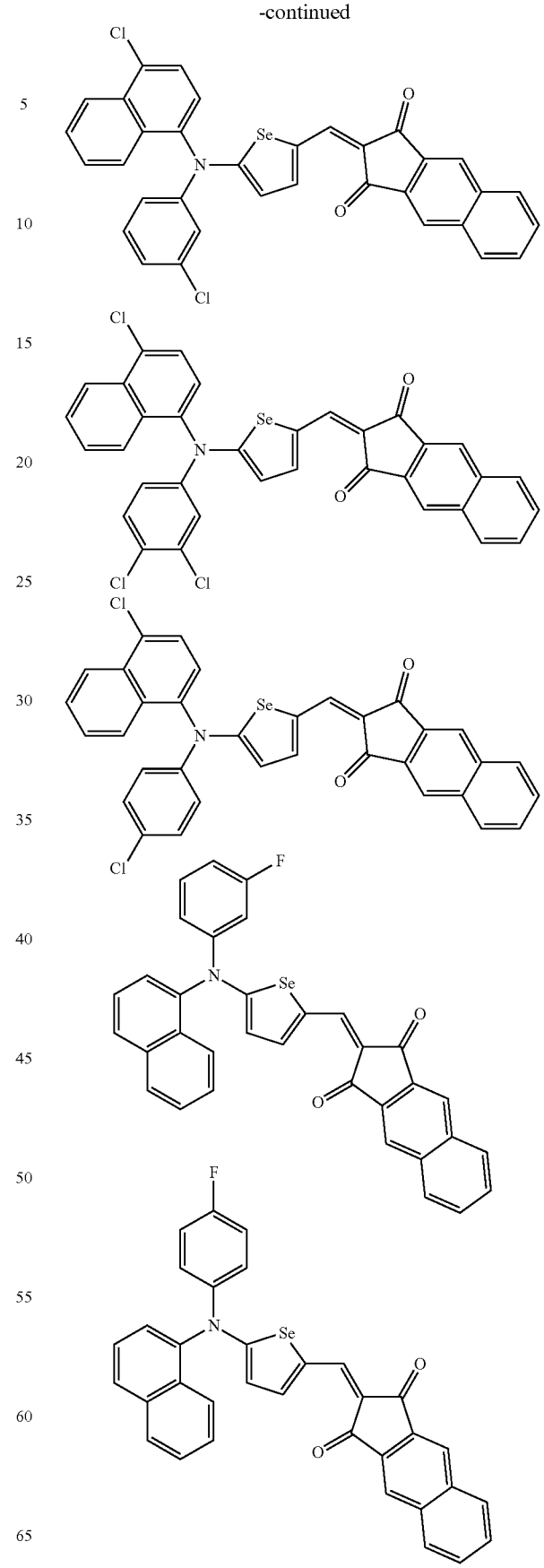

-continued
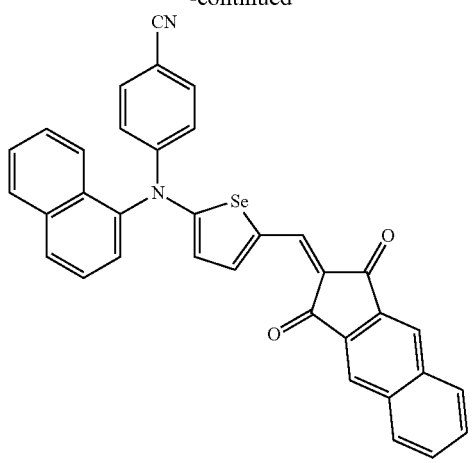
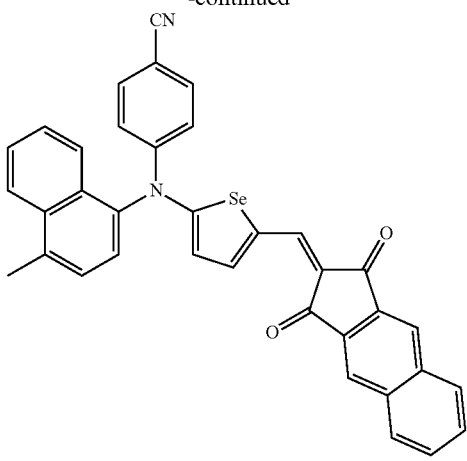
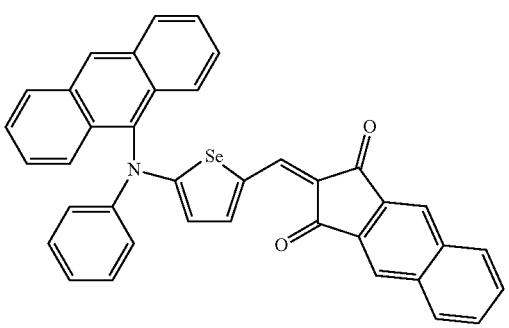
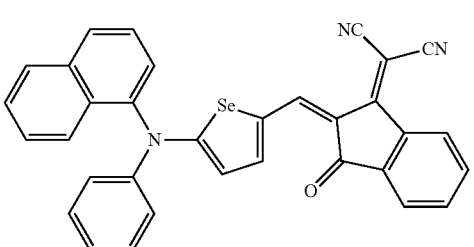
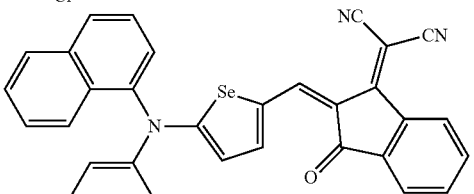
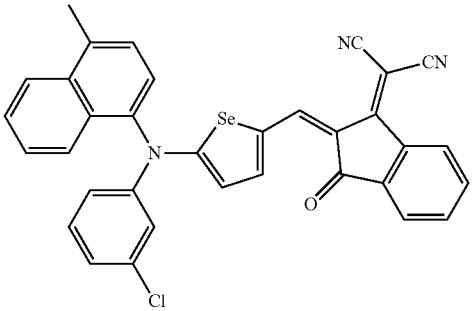

-continued
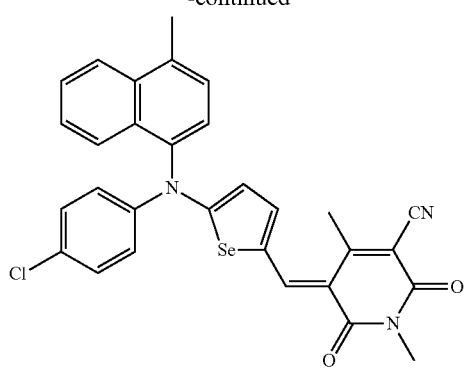
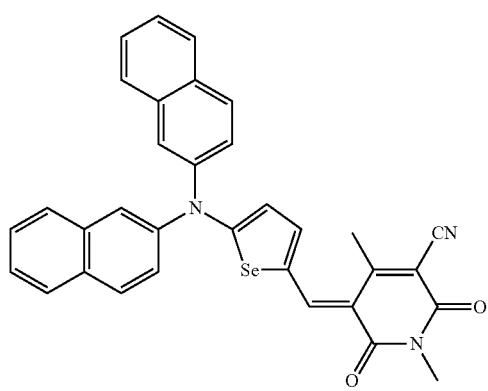
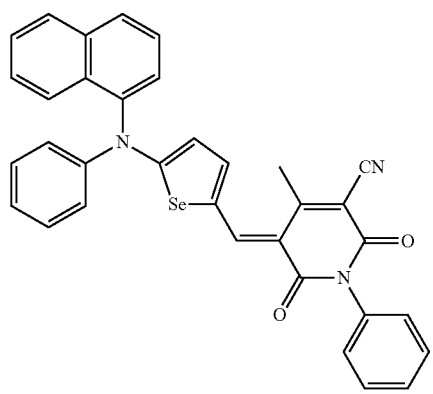
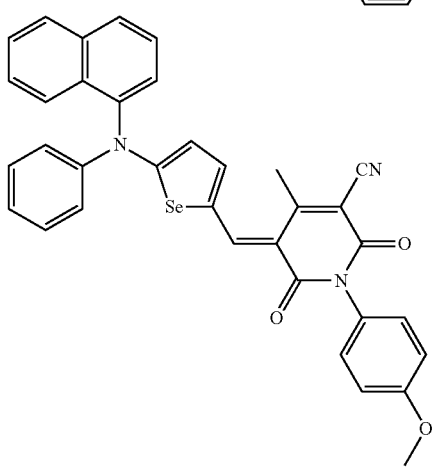
-continued
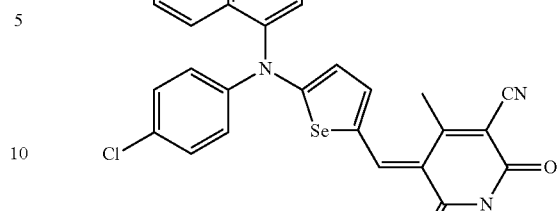
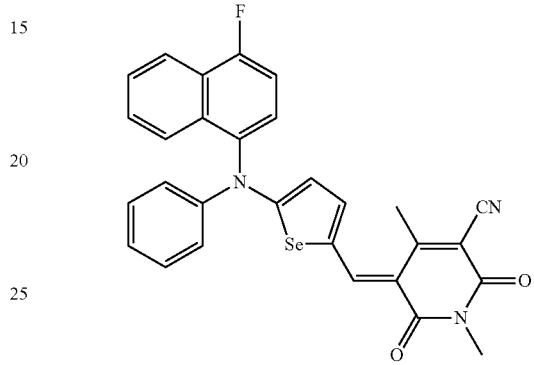
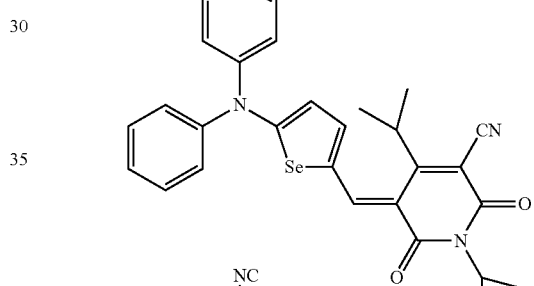
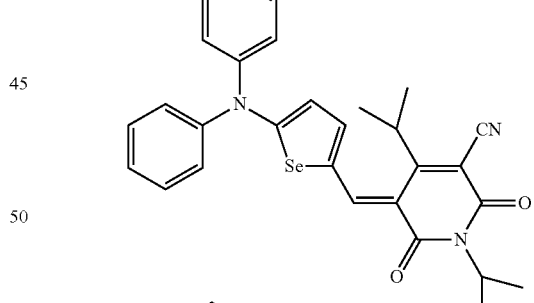
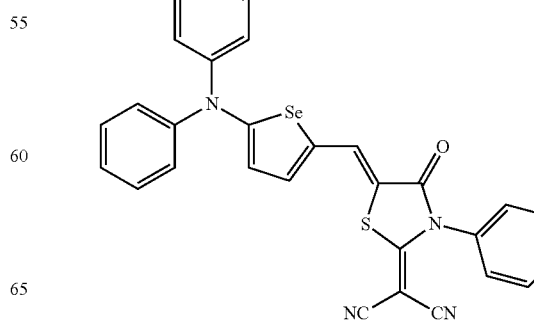

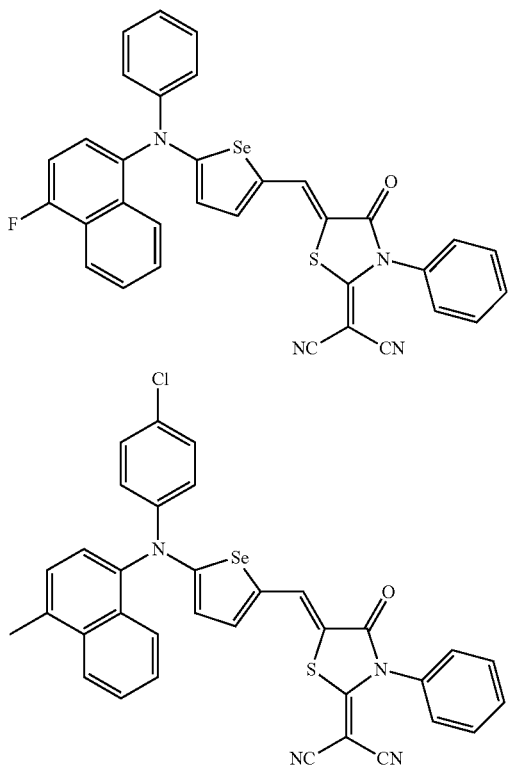 [SMILES: N#CC(C#N)=c1s/c(=C\c2ccc(N(c3ccccc3)c3ccc(F)c4ccccc34)[se]2)c(=O)n1-c1ccccc1 ; Cc1ccc(N(c2ccc(Cl)cc2)c2ccc(/C=c3\sc(=C(C#N)C#N)n(-c4ccccc4)c3=O)[se]2)c2ccccc12]

The p-type semiconductor may be, for example a light-absorbing material represented by one of Chemical Formulae 1B-1 to 1B-4, but is not limited thereto.

[Chemical Formula 1B-1]

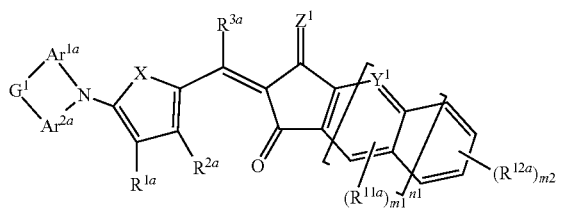

[Chemical Formula 1B-2]

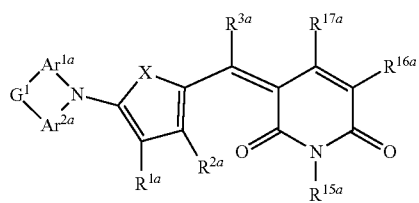

[Chemical Formula 1B-3]

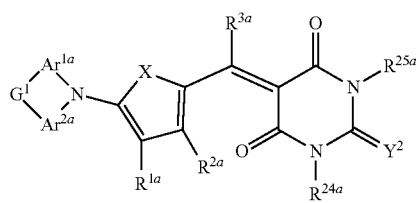

[Chemical Formula 1B-4]

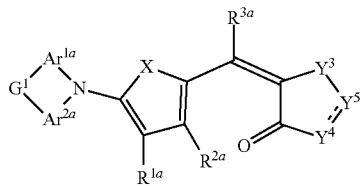

In Chemical Formulae 1B-1 to 1B-4,
X is Se, Te, SO, $SO_2$, or $SiR^aR^b$,
$Z^1$ is O or $CR^cR^d$,
$Y^1$ is N or $CR^e$,
$Y^2$ is one of O, S, Se, Te, and $C(R^f)(CN)$,
$Y^3$ is O, S, Se, or Te,
$Y^4$ is N or $NR^{18a}$,
$Y^5$ is $CR^{19a}$ or $C=CR^{20a}(CN)$,
each of $Ar^{1a}$ and $Ar^{2a}$ are independently a substituted or unsubstituted $C_6$ to $C_{30}$ aryl group or a substituted or unsubstituted $C_3$ to $C_{30}$ heteroaryl group,
$G^1$ is one of a single bond, $-(CR^gR^h)_{n2}-$, $-O-$, $-S-$, $-Se-$, $-N=$, $-NR^i-$, $-SiR^jR^k-$, and $-GeR^lR^m-$, wherein n2 is 1 or 2,
each of $R^{1a}$ to $R^{3a}$, $R^{11a}$, $R^{12a}$, $R^{15a}$ to $R^{20a}$, $R^{24a}$, $R^{25a}$, and $R^a$ to $R^m$ are independently hydrogen, a substituted or unsubstituted $C_1$ to $C_{30}$ alkyl group, a substituted or unsubstituted $C_6$ to $C_{30}$ aryl group, a substituted or unsubstituted $C_3$ to $C_{30}$ heteroaryl group, a substituted or unsubstituted $C_1$ to $C_6$ alkoxy group, a halogen, or a cyano group,
n1 is 0 or 1,
n2 is 0, 1 or 2,
m1 is 0 or 1, and
m2 is an integer ranging from 0 to 4.

The light-absorbing material represented by one of Chemical Formulae 1B-1 to 1B-4 may be, for example compounds of Group 2, but is not limited thereto.

[Group 2]

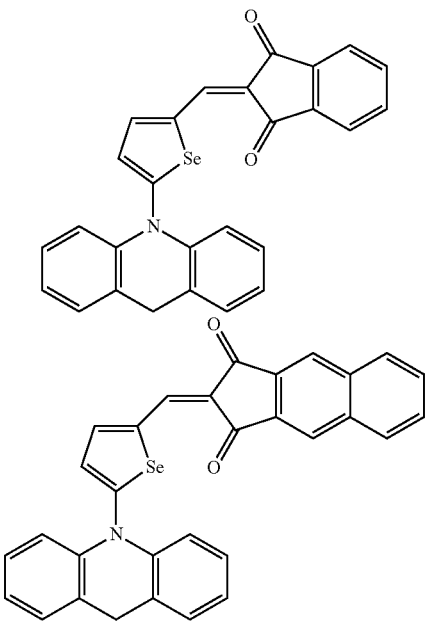

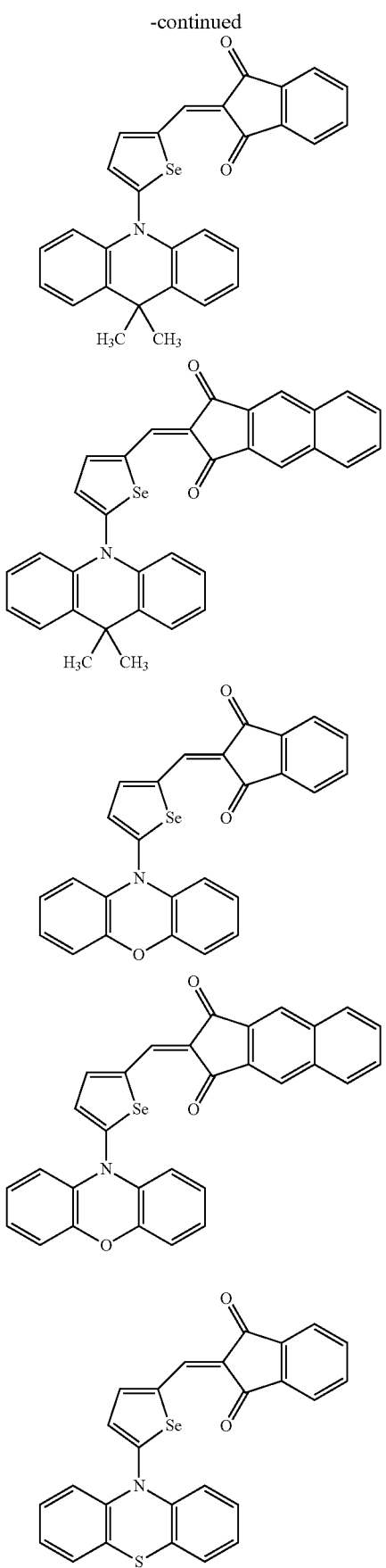
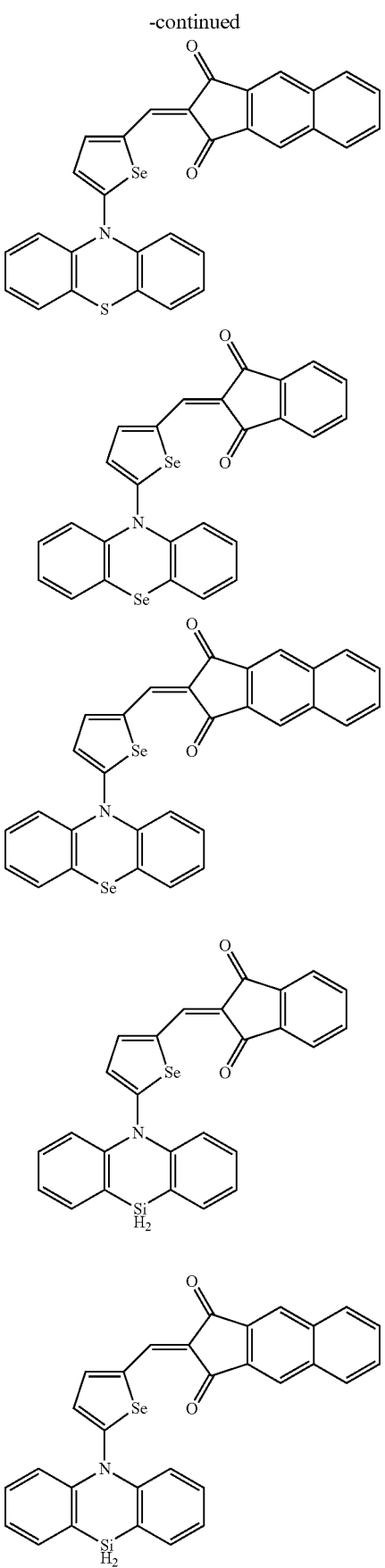

31
-continued
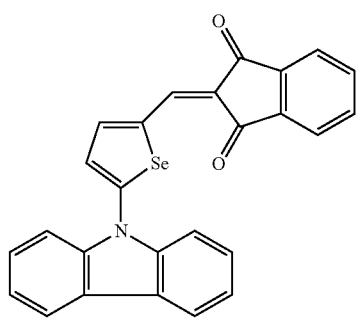
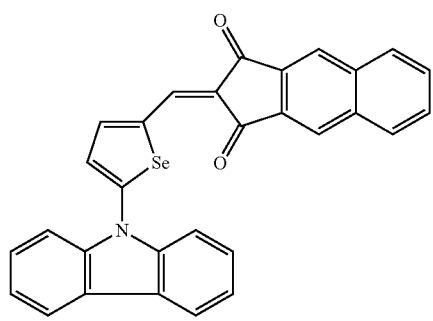
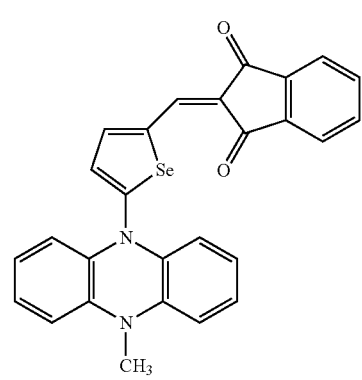
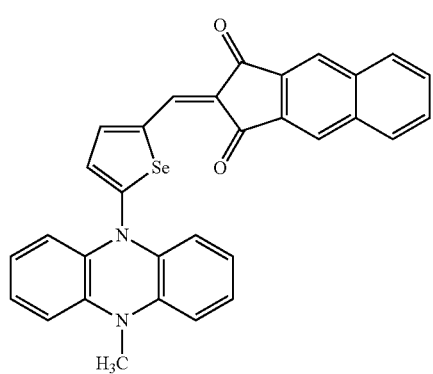
32
-continued
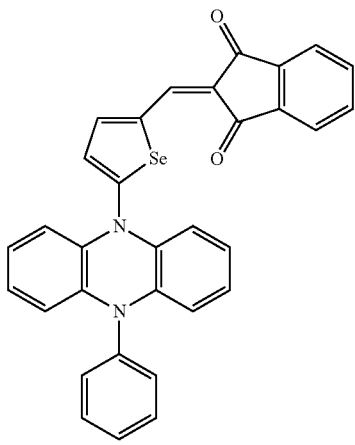
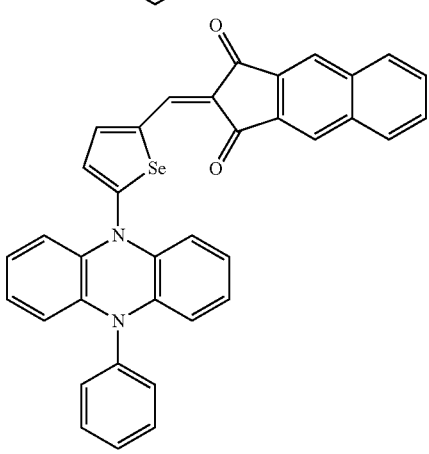
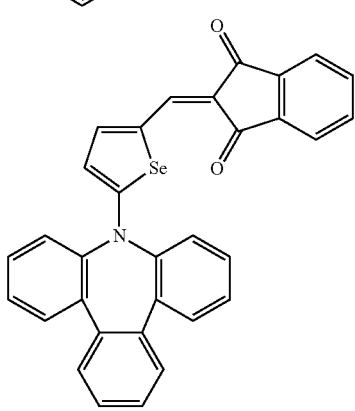
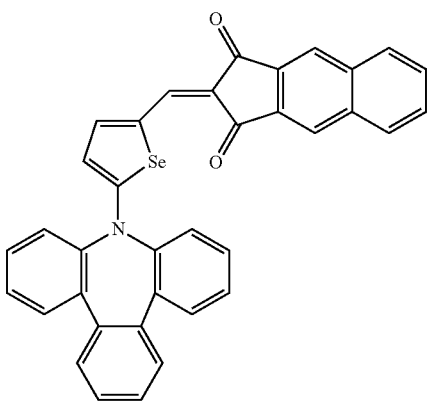

33
-continued
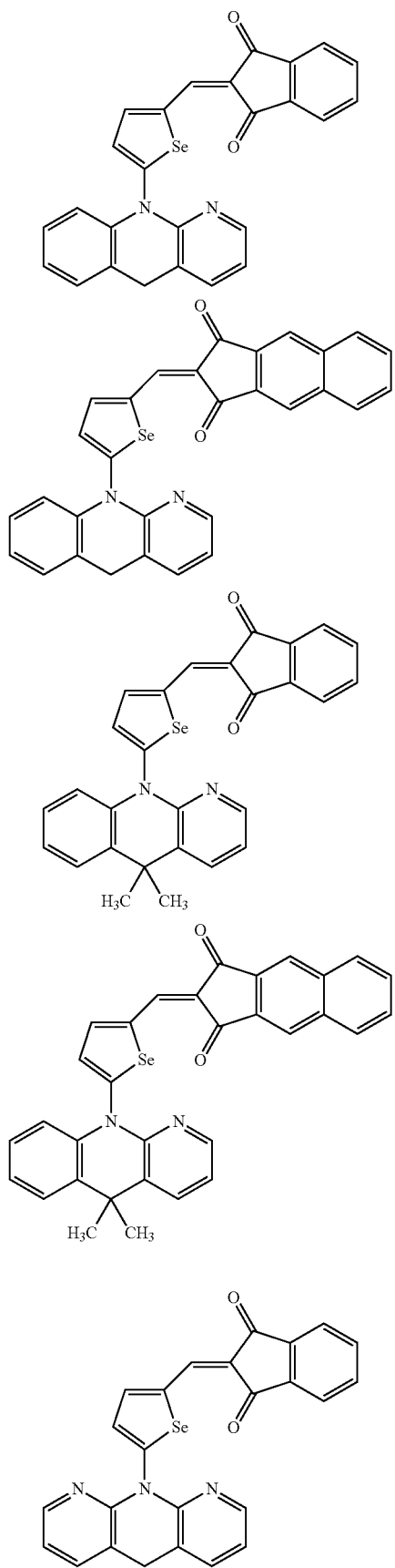
34
-continued
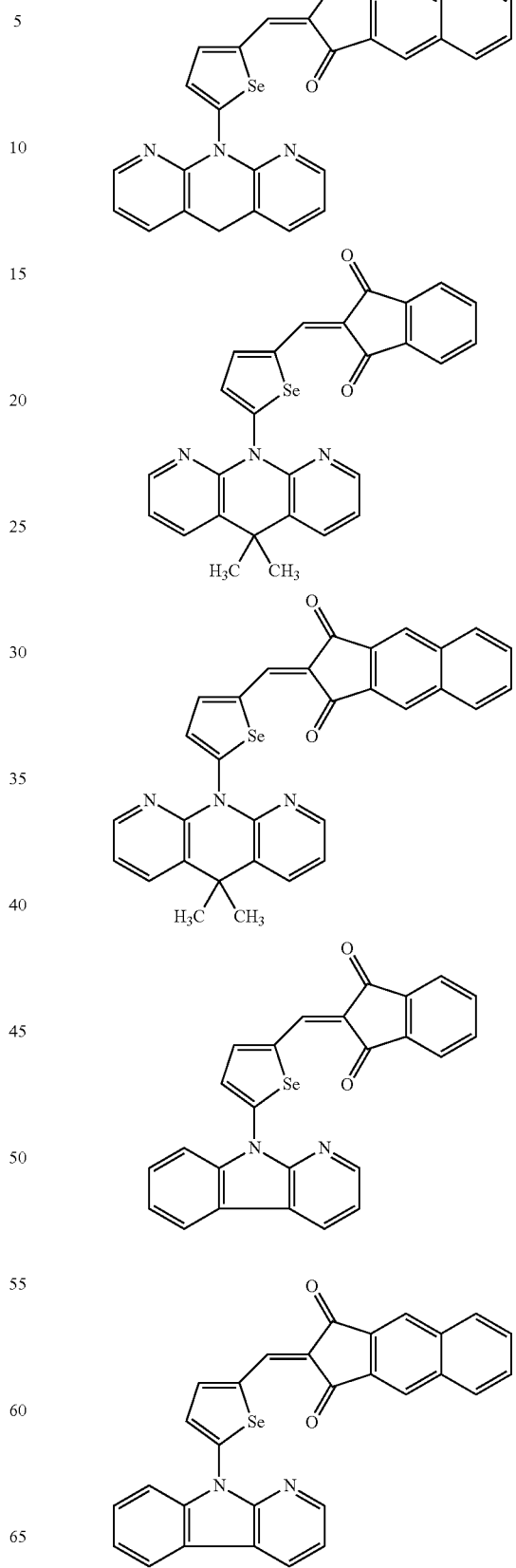

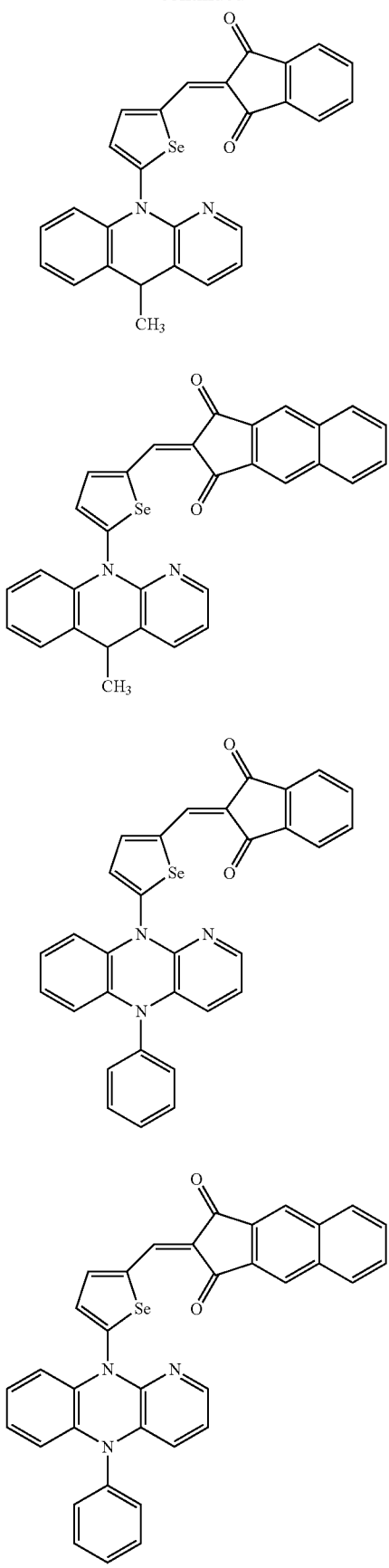
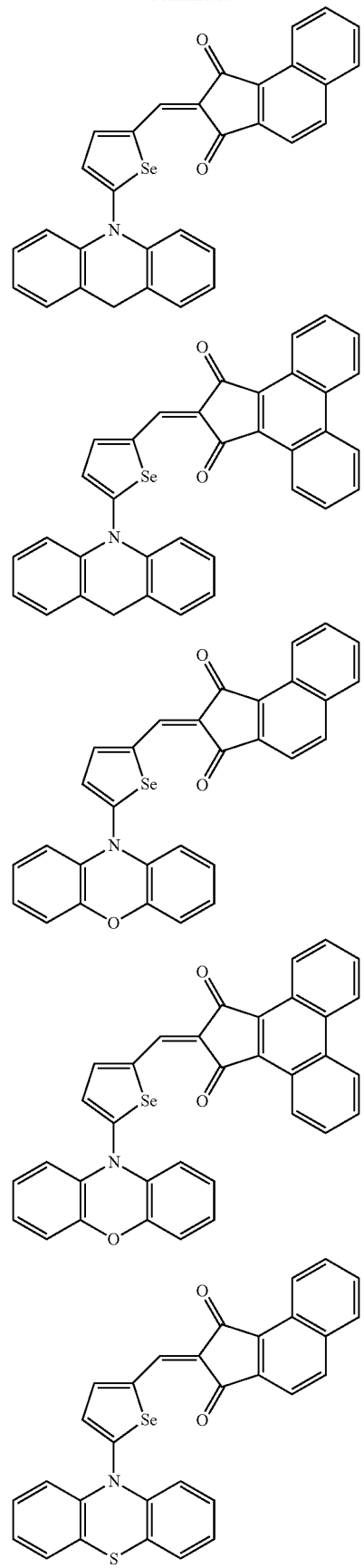

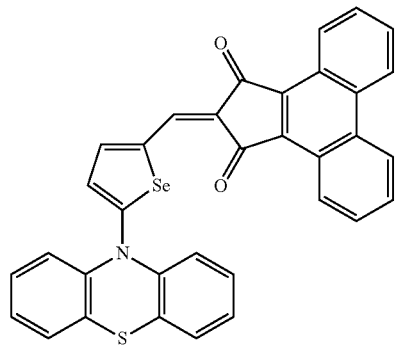
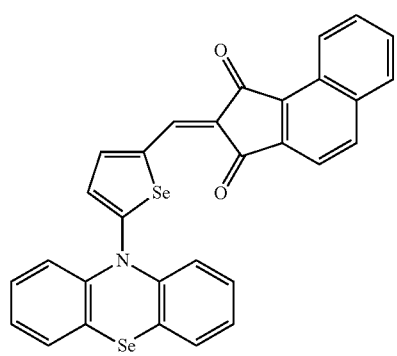
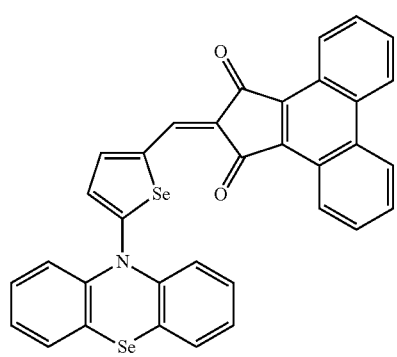
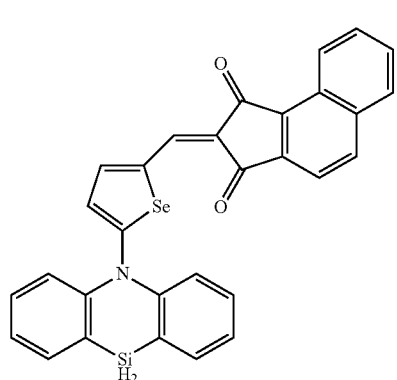
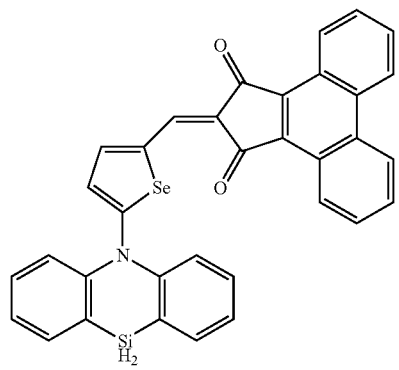
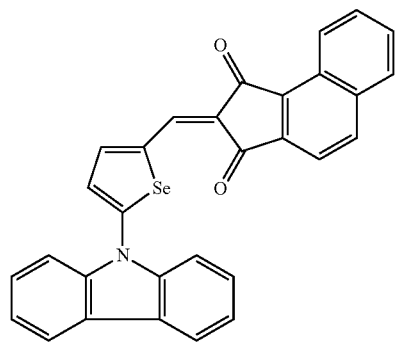
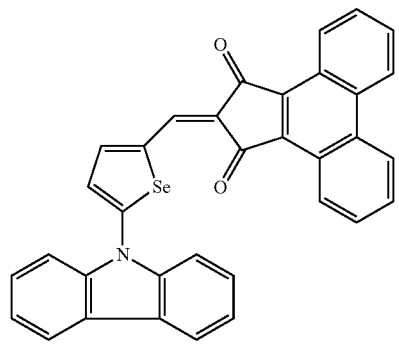
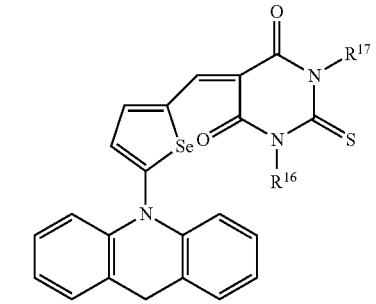
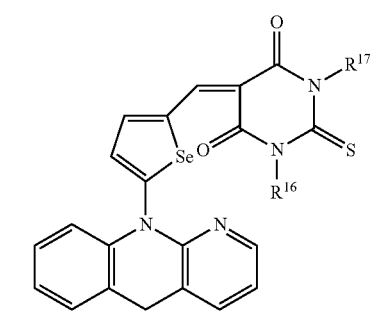

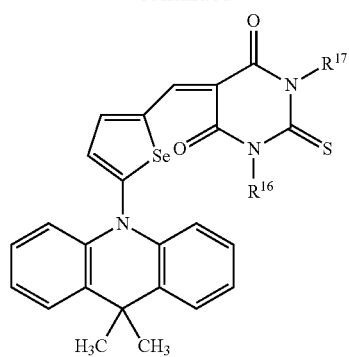
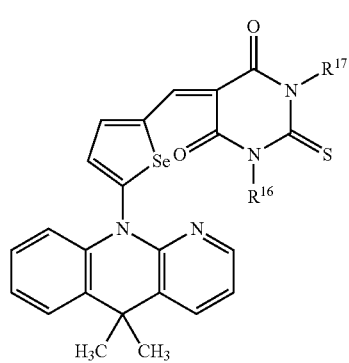
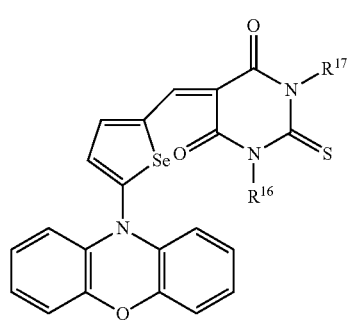
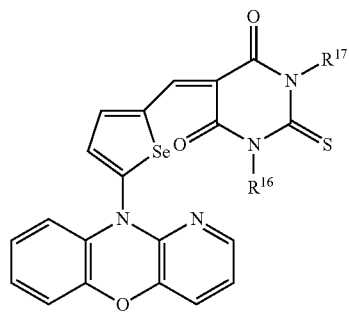
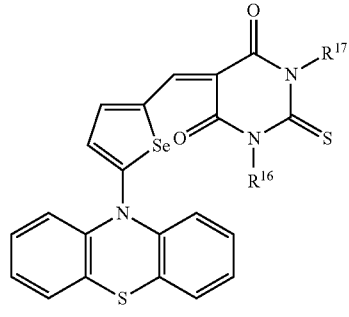
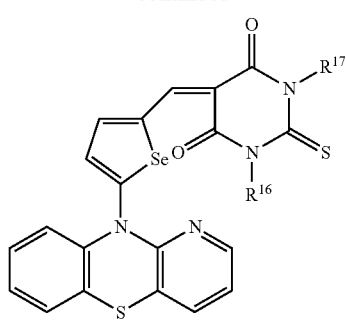
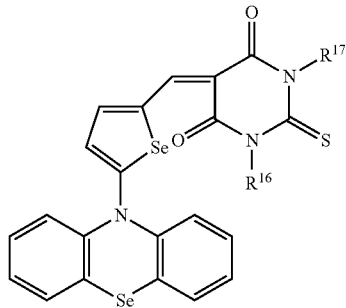
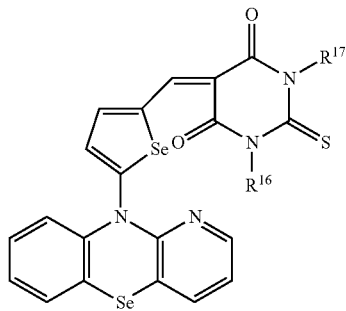
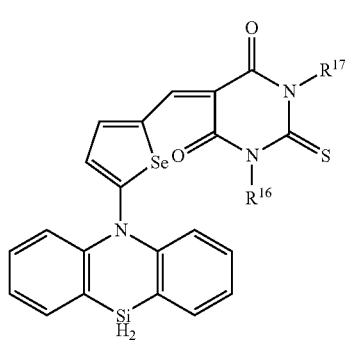
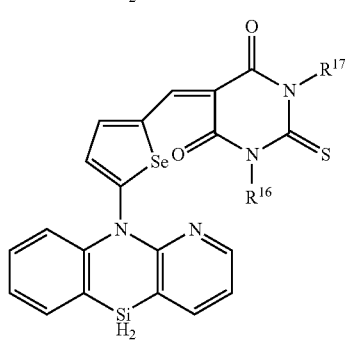

-continued
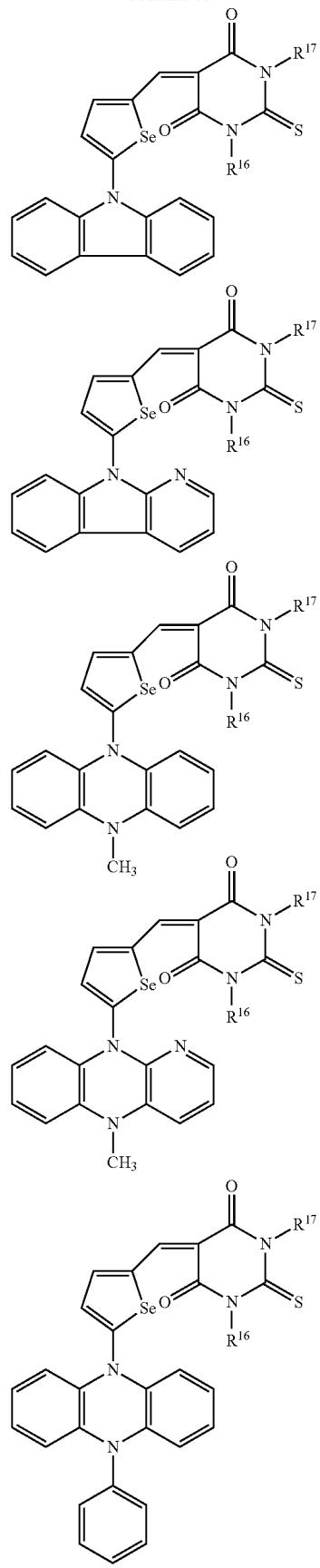
-continued
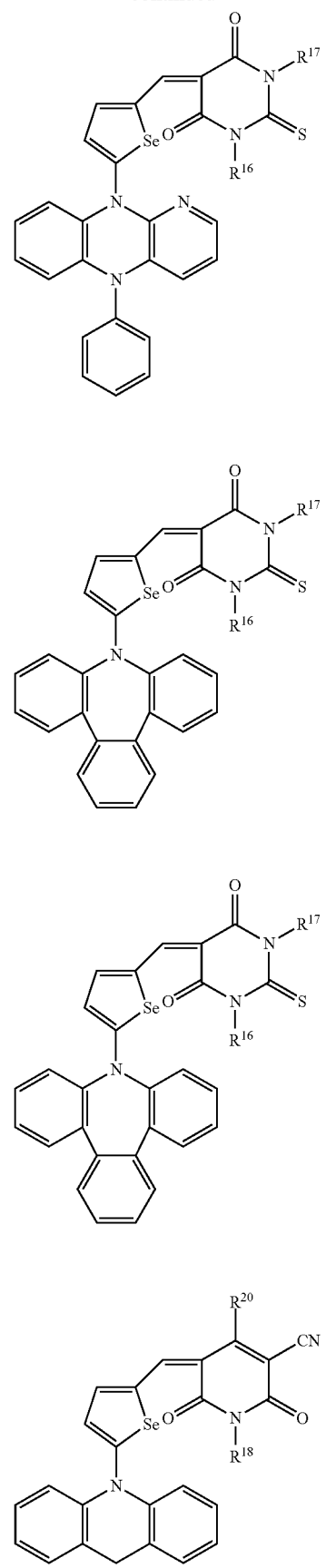

-continued
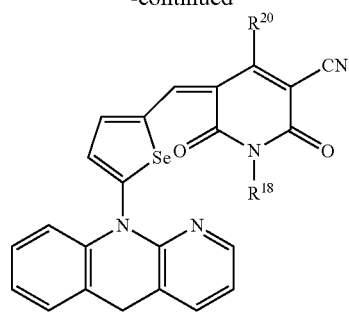
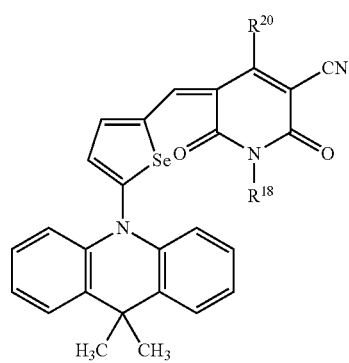
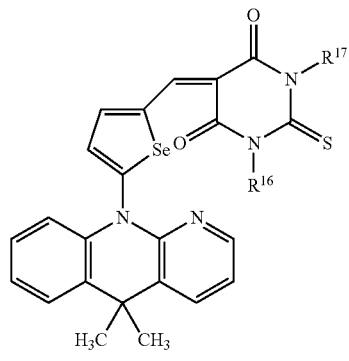
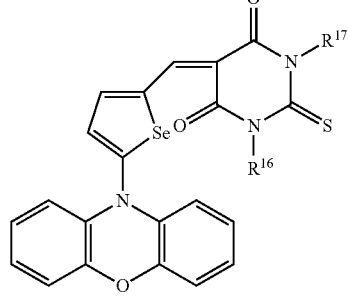
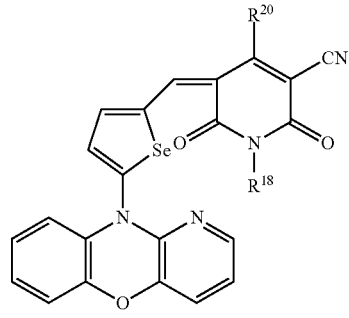
-continued
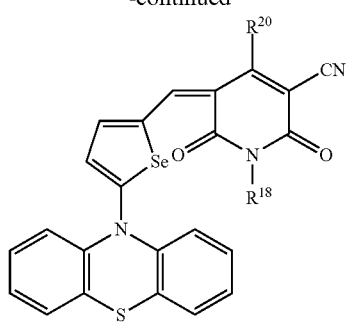
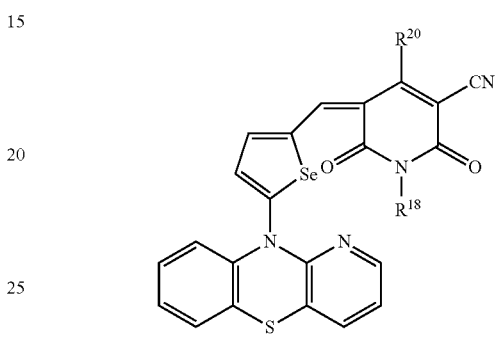
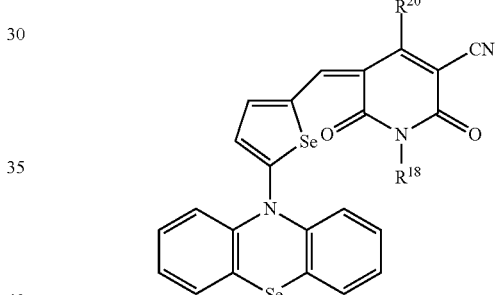
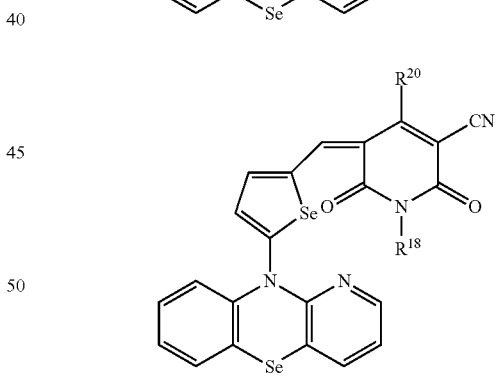
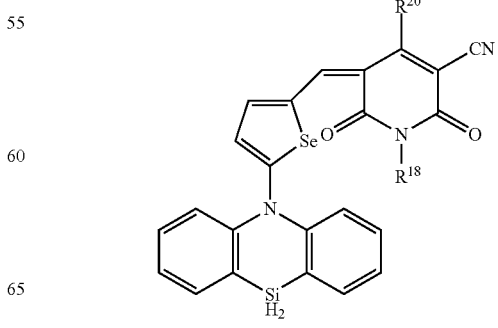

-continued
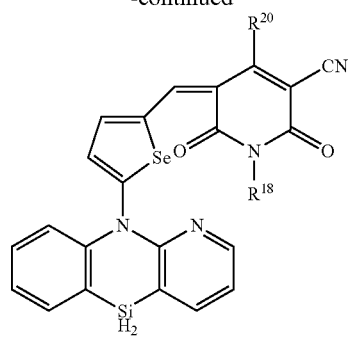
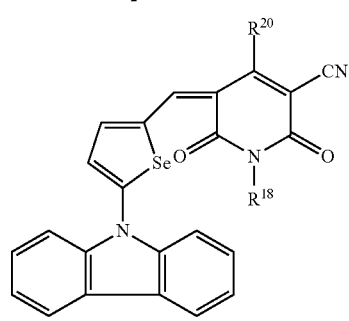
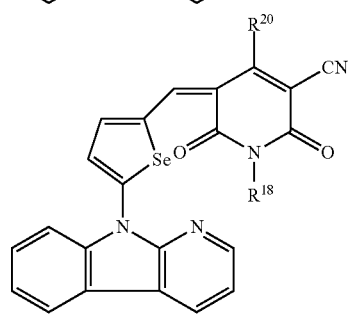
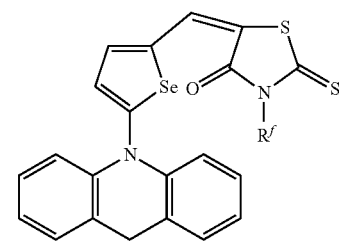
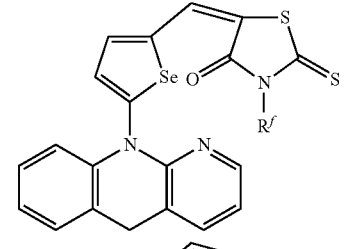
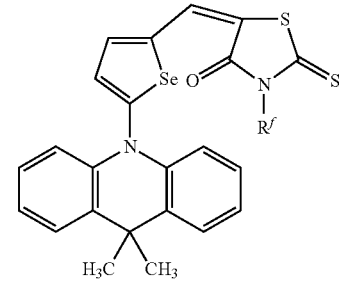
-continued
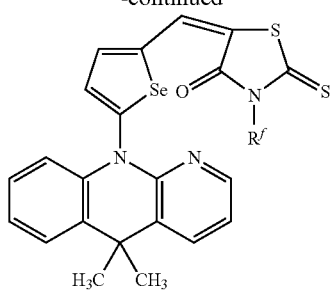
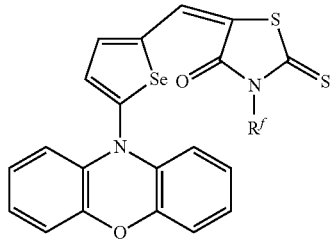
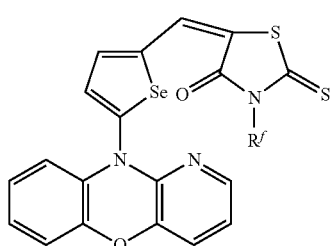
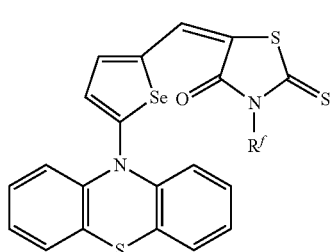
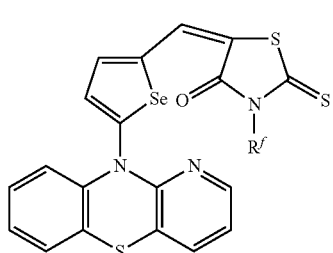
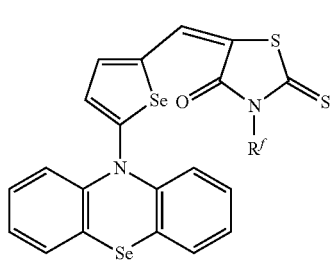

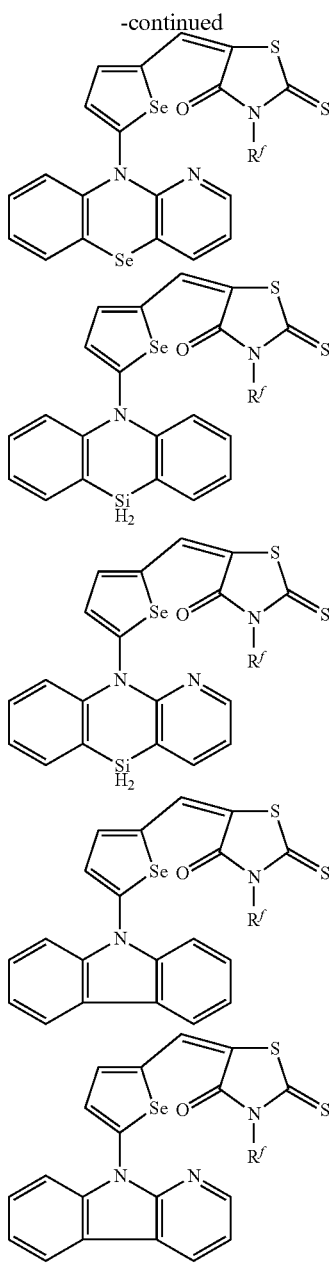

In Group 2, hydrogen of each aromatic ring may be replaced by a substituent selected from a substituted or unsubstituted $C_1$ to $C_{30}$ alkyl group, a substituted or unsubstituted $C_1$ to $C_{30}$ alkoxy group, a substituted or unsubstituted $C_6$ to $C_{30}$ aryl group, a substituted or unsubstituted $C_4$ to $C_{30}$ heteroaryl group, a halogen, a cyano group, a cyano-containing group, and a combination thereof, $R^{16}$, $R^{17}$, $R^{18}$, $R^{20}$, and $R^f$ are independently hydrogen, a substituted or unsubstituted $C_1$ to $C_{30}$ alkyl group, a substituted or unsubstituted $C_1$ to $C_{30}$ alkoxy group, a substituted or unsubstituted $C_6$ to $C_{30}$ aryl group, a substituted or unsubstituted $C_4$ to $C_{30}$ heteroaryl group, a halogen, a cyano group, a cyano-containing group, or a combination thereof.

The first and second photoelectronic conversion layers 31 and 32 may further include a p-type layer and/or an n-type layer on one surface or both surfaces of the intrinsic layer. The p-type layer may include a p-type semiconductor and the n-type layer may include an n-type semiconductor. For example, they may be included in various combinations of a p-type layer/l layer, an l layer/n-type layer, a p-type layer/l layer/n-type layer, etc.

The organic photoelectronic device 100 may further include an anti-reflection layer (not shown) on the first electrode 10 or the second electrode 20. The anti-reflection layer is disposed at a light incidence side and lowers reflectance of light of incident light and thereby light absorption is further improved. For example, when light enters at the first electrode 10, the anti-reflection layer may be disposed on the first electrode 10 and when light enters at the second electrode 20, the anti-reflection layer may be disposed on the second electrode 20.

The anti-reflection layer may include, for example a material having a refractive index of about 1.6 to about 2.5, and may include for example at least one of a metal oxide, a metal sulfide, and an organic material having a refractive index within the ranges. The anti-reflection layer may include, for example, a metal oxide including an aluminum-containing oxide, a molybdenum-containing oxide, a tungsten-containing oxide, a vanadium-containing oxide, a rhenium-containing oxide, a niobium-containing oxide, a tantalum-containing oxide, a titanium-containing oxide, a nickel-containing oxide, a copper-containing oxide, a cobalt-containing oxide, a manganese-containing oxide, a chromium-containing oxide, a tellurium-containing oxide, or a combination thereof; a metal sulfide including zinc sulfide; or an organic material including an amine derivative, but is not limited thereto.

In the organic photoelectronic device 100, when light enters from the first electrode 10 or the second electrode 20 and the first and second photoelectronic conversion layers 31 and 32 absorb light having a given or predetermined wavelength region, excitons may be produced from in the first and second photoelectronic conversion layers 31 and 32. The excitons are separated into holes and electrons in the first and second photoelectronic conversion layers 31 and 32, and the separated holes are transported to an anode that is one of the first electrode 10 and second electrode 20 and the separated electrons are transported to the cathode that is the other of and the first electrode 10 and the second electrode 20 so as to flow a current.

Hereinafter, an organic photoelectronic device according to example embodiments is illustrated.

Figure 2:
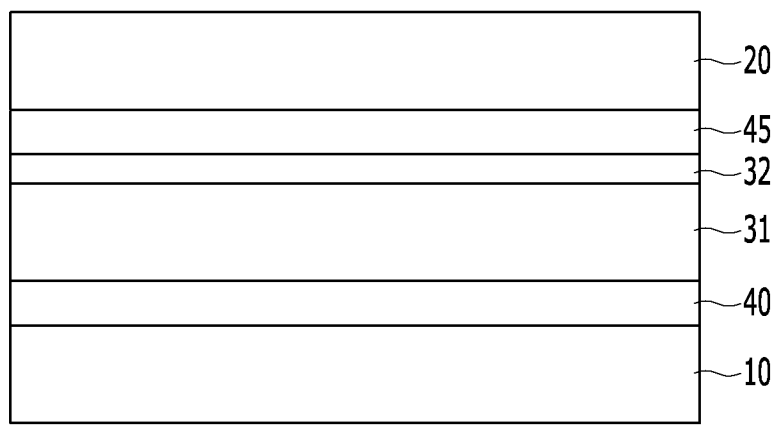
FIG. 2 is a cross-sectional view showing an organic photoelectronic device according to example embodiments.

FIG. 2 is a cross-sectional view showing an organic photoelectronic device according to example embodiments.

Referring to FIG. 2, an organic photoelectronic device 200 according to example embodiments includes a first electrode 10 and a second electrode 20 facing each other, and the first and second photoelectronic conversion layers 31 and 32 between the first electrode 10 and the second electrode 20, like the example embodiment illustrated in FIG. 1. The first and second photoelectronic conversion layers 31 and 32 may include a p-type semiconductor and an n-type semiconductor at a different composition ratio as described above.

However, the organic photoelectronic device 200 according to example embodiments further includes charge auxiliary layers 40 and 45 between the first electrode 10 and the first photoelectronic conversion layer 31 and the second electrode 20 and the second photoelectronic conversion layer 32. The charge auxiliary layers 40 and 45 may facilitate the transfer of holes and electrons separated from the first and second photoelectronic conversion layers 31 and 32, so as to increase efficiency.

The charge auxiliary layers 40 and 45 may be at least one of a hole injection layer (HIL) for facilitating hole injection, a hole transport layer (HTL) for facilitating hole transport, an electron blocking layer (EBL) for reducing or preventing electron transport, an electron injection layer (EIL) for facilitating electron injection, an electron transport layer (ETL) for facilitating electron transport, and a hole blocking layer (HBL) for reducing or preventing hole transport.

The charge auxiliary layers 40 and 45 may include, for example, an organic material, an inorganic material, or an organic/inorganic material. The organic material may be an organic compound having hole or electron characteristics, and the inorganic material may be, for example, a metal oxide including molybdenum oxide, tungsten oxide, nickel oxide, etc.

The hole transport layer (HTL) may include one of, for example, poly(3,4-ethylenedioxythiophene):poly(styrene-sulfonate) (PEDOT:PSS), polyarylamine, poly(N-vinylcarbazole), polyaniline, polypyrrole, N,N,N',N'-tetrakis(4-methoxyphenyl)-benzidine (TPD), 4-bis[N-(1-naphthyl)-N-phenyl-amino]biphenyl (α-NPD), m-MTDATA, 4,4',4''-tris(N-carbazolyl)-triphenylamine (TCTA), and a combination thereof, but is not limited thereto.

The electron blocking layer (EBL) may include one of, for example, poly(3,4-ethylenedioxythiophene):poly(styrene-sulfonate) (PEDOT:PSS), polyarylamine, poly(N-vinylcarbazole), polyaniline, polypyrrole, N,N,N',N'-tetrakis(4-methoxyphenyl)-benzidine (TPD), 4-bis[N-(1-naphthyl)-N-phenyl-amino]biphenyl (α-NPD), m-MTDATA, 4,4',4''-tris(N-carbazolyl)-triphenylamine (TCTA), and a combination thereof, but is not limited thereto.

The electron transport layer (ETL) may include one of, for example, 1,4,5,8-naphthalene-tetracarboxylic dianhydride (NTCDA), bathocuproine (BCP), LiF, $Alq_3$, $Gaq_3$, $Inq_3$, $Znq_2$, $Zn(BTZ)_2$, $BeBq_2$, and a combination thereof, but is not limited thereto.

The hole blocking layer (HBL) may include one of, for example, 1,4,5,8-naphthalene-tetracarboxylic dianhydride (NTCDA), bathocuproine (BCP), LiF, $Alq_3$, $Gaq_3$, $Inq_3$, $Znq_2$, $Zn(BTZ)_2$, $BeBq_2$, and a combination thereof, but is not limited thereto.

Either one of the charge auxiliary layers 40 and 45 may be omitted.

The organic photoelectronic device may be applied to a solar cell, an image sensor, a photo-detector, a photo-sensor, and an organic light emitting diode (OLED), but is not limited thereto.

The organic photoelectronic device may be for example applied to an image sensor.

Hereinafter, an example of an image sensor including the organic photoelectronic device is described referring to drawings. As an example of an image sensor, an organic CMOS image sensor is illustrated.

Figure 3:
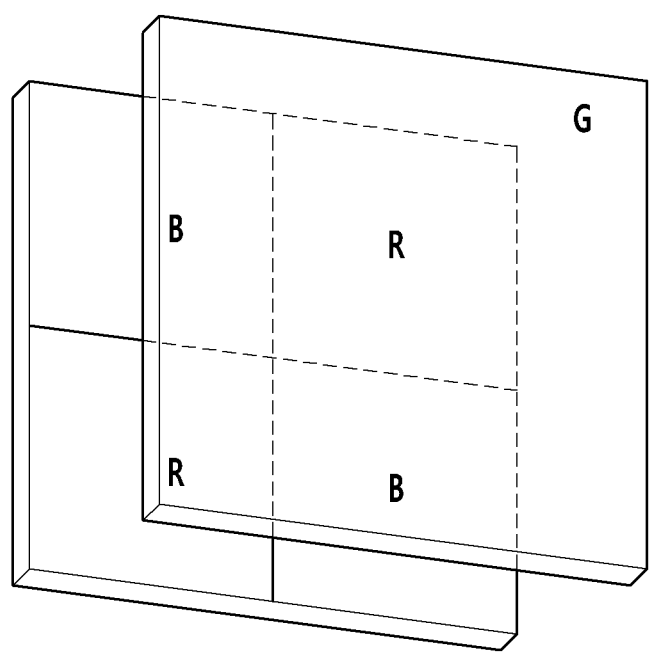
FIG. 3 is a schematic top plan view showing an organic CMOS image sensor according to example embodiments.
Figure 4A:
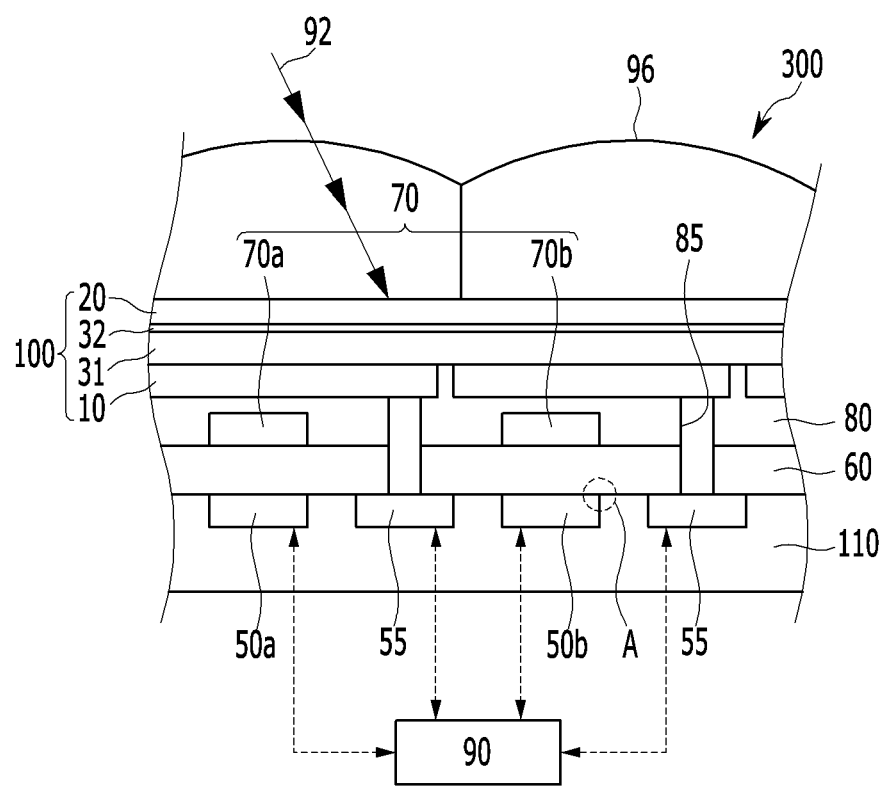
FIG. 4A is a cross-sectional view showing one example of the organic CMOS image sensor of FIG. 3.

FIG. 3 is a schematic top plan view of an organic CMOS image sensor according to example embodiments. FIG. 4A is a cross-sectional view showing one example of the organic CMOS image sensor of FIG. 3, and FIG. 4B is a cross-section view of a portion A of the image sensor 300 illustrated in FIG. 4A.

Figure 4B:
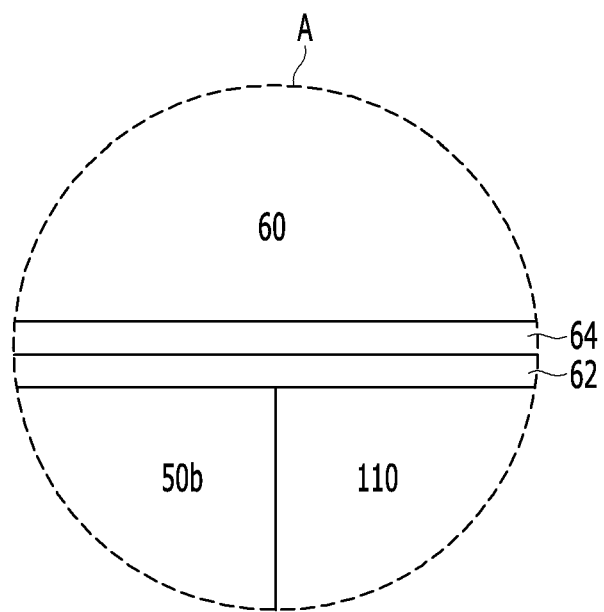
FIG. 4B is a cross-section view of a portion A of the image sensor 300 illustrated in FIG. 4A.

Referring to FIGS. 3, 4A and 4B, an organic CMOS image sensor 300 according to example embodiments includes a semiconductor substrate 110 integrated with photo-sensing devices 50a and 50b, a transmission transistor 90, and a charge storage 55, a lower insulation layer 60, a color filter layer 70, an upper insulation layer 80, and an organic photoelectronic device 100.

The semiconductor substrate 110 may be a silicon substrate, and is integrated with the photo-sensing devices 50a and 50b, the transmission transistor 90, and the charge storage 55. The photo-sensing devices 50a and 50b may be photodiodes.

The photo-sensing devices 50a and 50b, the transmission transistor 90, and/or the charge storage 55 may be integrated in each pixel, and as shown in the drawing, the photo-sensing devices 50a and 50b may be included in a blue pixel and a red pixel and the charge storage 55 may be included in a green pixel.

The photo-sensing devices 50a and 50b sense light in separate wavelength spectra of light (herein, referred to as first and second light, respectively) and may generate separate, respective instances of information based on the sensing. The separate, respective instances of information associated with the light sensed by the first and second photo-sensing devices 50a and 50b may be transferred by the transmission transistor 90. The transmission transistor 90 may transmit received information to one or more additional devices, including one or more devices that are external to the image sensor 300. An image may be generated based on the information transmitted from the transmission transistor 90, where the image is associated with the incident light sensed at one or more elements of the image sensor 300. The charge storage 55 is electrically connected with the organic photoelectronic device 100 and may receive information associated with the light sensed by the organic photoelectronic device 100, where such information is generated by one or more elements of the organic photoelectronic device 100 based on sensing one or more wavelength spectra of light. Information stored by the charge storage 55 may be transferred to the transmission transistor 90. The transmission transistor 90 may transmit received information, thereby transmitting information associated with the light sensed by the first and second photo-sensing devices 50a and 50b, and the organic photoelectronic device 100. The transmission transistor 90 may transmit the information to one or external devices that are external to the image sensor 300. In some example embodiments, including the example embodiments shown in FIG. 4B, a metal wire 62 and a pad 64 are formed on the semiconductor substrate 110. In order to decrease signal delay, the metal wire 62 and pad 64 may at least partially comprise a metal having relatively low resistivity, for example, aluminum (Al), copper (Cu), silver (Ag), and alloys thereof, but are not limited thereto. In some example embodiments, the metal wire 62 and pad 64 may be positioned under the photo-sensing devices 50a and 50b.

Referring back to FIG. 4A, the lower insulation layer 60 is formed on the metal wire 62 and the pad 64. The lower insulation layer 60 may at least partially comprise an inorganic insulating material including a silicon oxide and/or a silicon nitride, or a low dielectric constant (low K) material including SiC, SiCOH, SiCO, and SiOF. The lower insulation layer 60 has a through-hole 85 exposing the charge storage 55. The through-hole 85 may be filled with fillers.

A color filter layer 70 is formed on the lower insulation layer 60. The color filter layer 70 includes a blue filter 70B formed in the blue pixel and a red filter 70R formed in the red pixel. In example embodiments, a green filter is not included, but a green filter may be further included.

The upper insulation layer 80 is formed on the color filter layer 70. The upper insulation layer 80 eliminates a step caused by the color filter layer 70 and smoothes the surface. The upper insulation layer 80 and lower insulation layer 60 may include a contact hole (not shown) exposing a pad, and the through-hole 85 exposing the charge storage 55 of a green pixel.

The organic photoelectronic device 100 is formed on the upper insulation layer 80. The organic photoelectronic device 100 includes the first electrode 10, the first and second photoelectronic conversion layers 31 and 32, and the second electrode 20 as described above. In the drawing, the first electrode 10, the first and second photoelectronic conversion layers 31 and 32, and the second electrode 20 are sequentially stacked but the present disclosure is not limited thereto, and they may be disposed in the order of the second electrode 20, the first and second photoelectronic conversion layers 32 and 31, and the first electrode 10.

The first electrode 10 and the second electrode 20 may be transparent electrodes, and the first and second photoelectronic conversion layers 31 and 32 are the same as described above. The first and second photoelectronic conversion layers 31 and 32 may selectively absorb, for example light in a green wavelength region, and replaces a color filter of a green pixel.

When light enters from the second electrode 20, the light in a green wavelength region may be mainly absorbed in the first and second photoelectronic conversion layers 31 and 32 and photoelectronically converted, while the light in the rest of the wavelength regions passes through the first electrode 10 and may be sensed in photo-sensing devices 50*a* and 50*b*.

Focusing lens 96 may be further formed on the organic photoelectronic device 100. The focusing lens 96 may control a direction of incident light and gather the light in one region. The focusing lens 96 may have a shape of, for example, a cylinder or a hemisphere, but is not limited thereto.

The organic photoelectronic device 100 has a stacked structure as described above and thus may realize a down-sized image sensor.

In FIG. 4A, the organic photoelectronic device 100 of FIG. 1 is included, but it is not limited thereto, and thus the organic photoelectronic device 200 of FIG. 2 may be applied in the same manner.

In FIG. 4A, a stack structure where an organic photoelectronic device configured to selectively absorb light in a green wavelength region is stacked is illustrated as an example, but the present disclosure is not limited thereto. The present disclosure may have a structure where an organic photoelectronic device configured to selectively absorb light in a blue wavelength region is stacked and a green photo-sensing device and a red photo-sensing device may be integrated in the semiconductor substrate 110, or a structure where an organic photoelectronic device configured to selectively absorb light in a red wavelength region is stacked and a green photo-sensing device and a blue photo-sensing device may be integrated in the semiconductor substrate 110.

Figure 5:
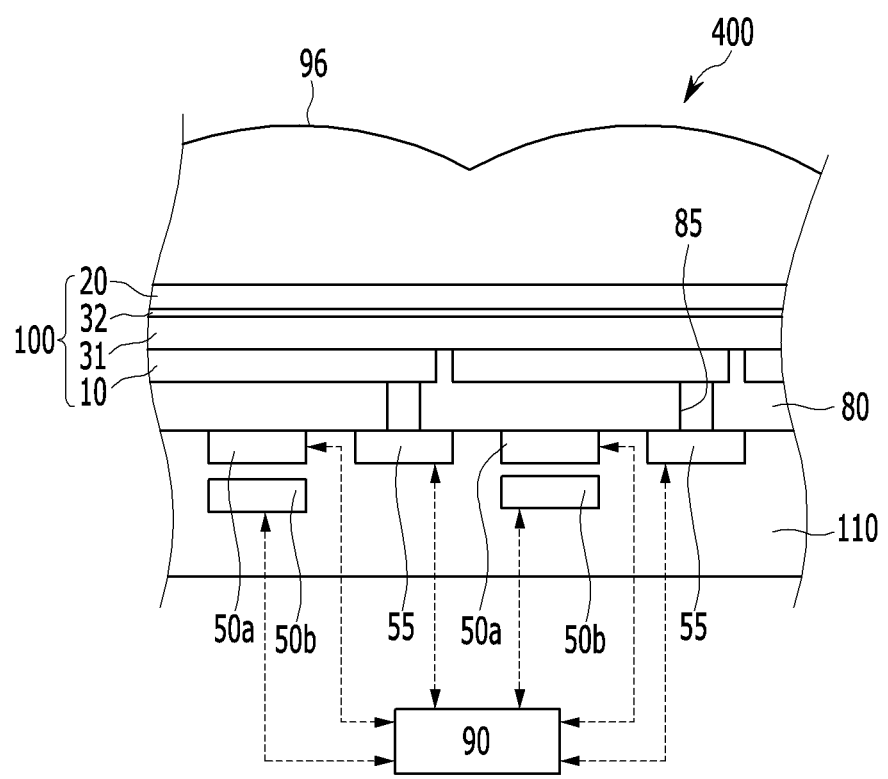
FIG. 5 is a cross-sectional view showing another example of the organic CMOS image sensor.

FIG. 5 is a cross-sectional view showing an organic CMOS image sensor according to example embodiments.

The organic CMOS image sensor 400 according to example embodiments includes the photo-sensing devices 50*a* and 50*b*, the semiconductor substrate 110 in which a transmission transistor 90 and the charge storage 55 are integrated, the upper insulation layer 80 having the through-hole 85, and the organic photoelectronic device 100 like the example embodiment illustrated in FIG. 4A.

However, in the organic CMOS image sensor 400 according to example embodiments, the photo-sensing devices 50*a* and 50*b* are stacked in a vertical direction, and the color filter layer 70 is omitted unlike the example embodiment illustrated in FIG. 4A. The photo-sensing devices 50*a* and 50*b* are electrically connected to a charge storage 55, and the information of the charge storage 55 may be transferred by a transmission transistor 90. The photo-sensing devices 50*a* and 50*b* may selectively absorb light in each wavelength region depending on a stacking depth.

Focusing lens 96 may be further formed on the organic photoelectronic device 100. The focusing lens 96 may control a direction of incident light 92 and gather the light in one region. The focusing lens 96 may have a shape of, for example, a cylinder or a hemisphere, but is not limited thereto.

As described above, the organic photoelectronic device configured to selectively absorb light in a green wavelength region has a stack structure and the red photo-sensing device and the blue photo-sensing device are stacked and thus the size of an image sensor may be reduced to realize a down-sized image sensor.

In FIG. 5, the organic photoelectronic device 100 of FIG. 1 is included, but it is not limited thereto, and thus the organic photoelectronic device 200 of FIG. 2 may be applied in the same manner.

In FIG. 5, a stack structure where an organic photoelectronic device configured to selectively absorb light in a green wavelength region is stacked is illustrated as an example, but the present disclosure is not limited thereto. The present disclosure may have a structure where an organic photoelectronic device configured to selectively absorb light in a blue wavelength region is stacked and a green photo-sensing device and a red photo-sensing device may be integrated in the semiconductor substrate 110, or a structure where an organic photoelectronic device configured to selectively absorb light in a red wavelength region is stacked and a green photo-sensing device and a blue photo-sensing device may be integrated in the semiconductor substrate 110.

Figure 6:
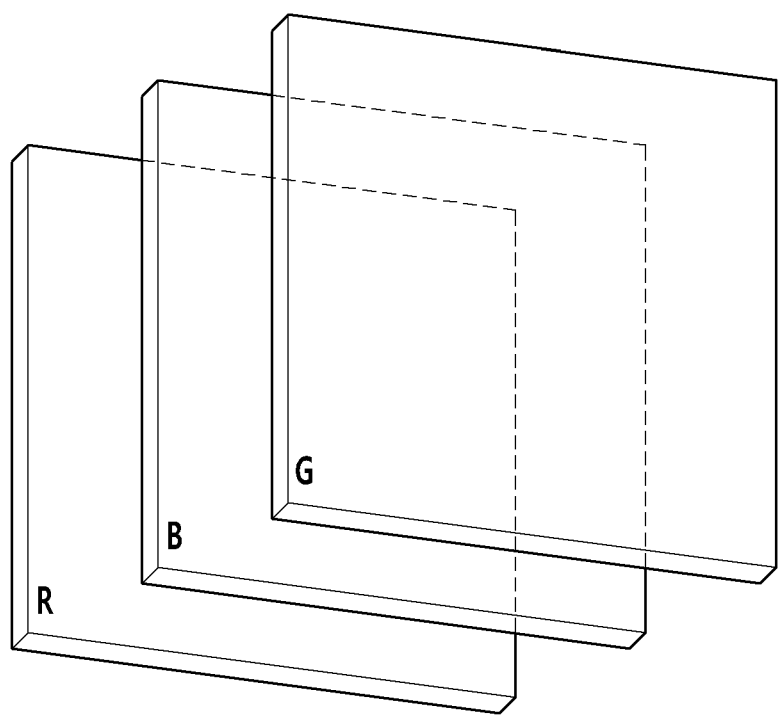
FIG. 6 is a schematic top plan view showing an organic CMOS image sensor according to example embodiments.
Figure 7A:
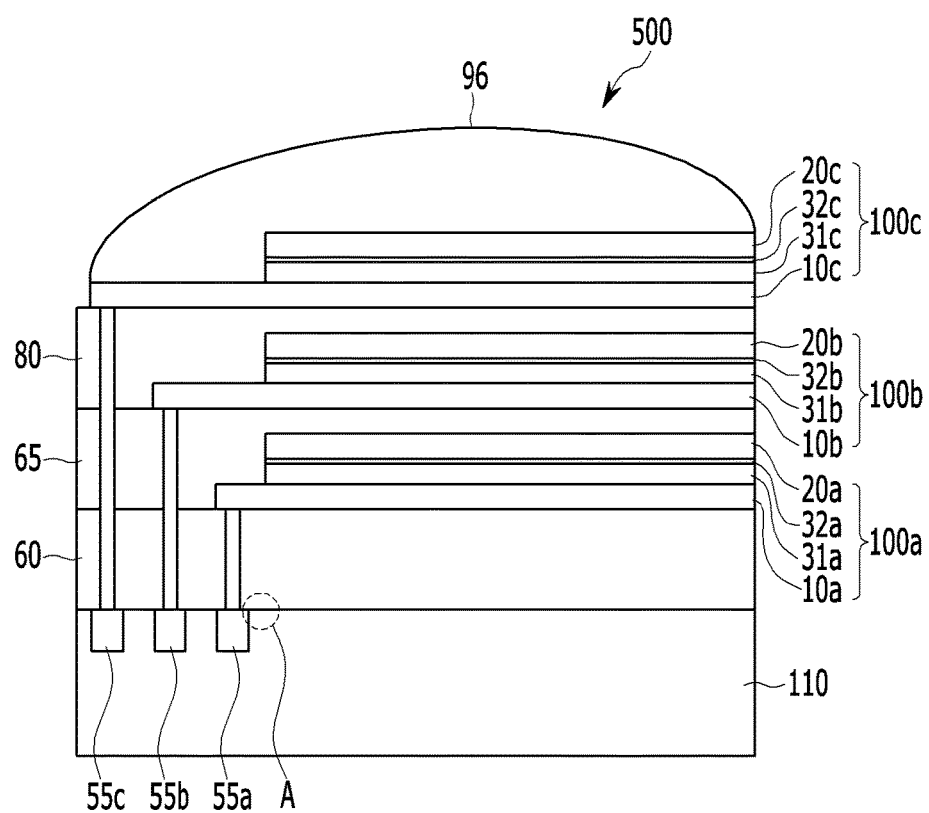
FIG. 7A is a cross-sectional view showing an organic CMOS image sensor of FIG. 6.
Figure 7B:
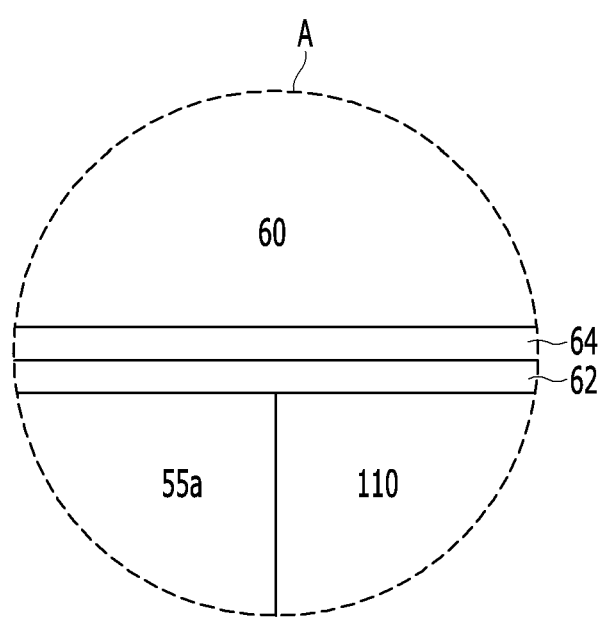
FIG. 7B is a cross-section view of a portion A of the image sensor 500 illustrated in FIG. 7A.

FIG. 6 is a schematic top plan view showing an organic CMOS image sensor according to example embodiments. FIG. 7A is a cross-sectional view of an organic CMOS image sensor of FIG. 6 and FIG. 7B is a cross-section view of a portion A of the image sensor 500 illustrated in FIG. 7A.

The organic CMOS image sensor 500 according to example embodiments includes a green photoelectronic device configured to selectively absorb light in a green wavelength region, a blue photoelectronic device configured to selectively absorb light in a blue wavelength region, and a red photoelectronic device configured to selectively absorb light in a green wavelength region, and they are stacked.

The organic CMOS image sensor 500 according to example embodiments includes a semiconductor substrate 110, a lower insulation layer 60, an intermediate insulation layer 65, an upper insulation layer 80, a first organic photoelectronic device 100*a*, a second organic photoelectronic device 100*b*, and a third organic photoelectronic device 100*c*.

The semiconductor substrate 110 may be a silicon substrate, and is integrated with the transmission transistor 90 and the charge storages 55*a*, 55*b*, and 55*c*.

In some example embodiments, including the example embodiments shown in FIG. 7B, a metal wire 62 and a pad 64 are formed on the semiconductor substrate 110, and the lower insulation layer 60 is formed on the metal wire 62 and the pad 64.

The first organic photoelectronic device 100*a* is formed on the lower insulation layer 60.

The first organic photoelectronic device 100*a* includes a first electrode 10*a* and a second electrode 20*a* facing each other, and first and second photoelectronic conversion layers 31a and 32a between the first electrode 10a and the second electrode 20a. The first electrode 10a, the second electrode 20a, and first and second photoelectronic conversion layers 31a and 32a are the same described above, and the first and second photoelectronic conversion layers 31a and 32a selectively absorb light in one of red, blue, and green wavelength regions. For example, the first organic photoelectronic device 100a may be a red photoelectronic device.

In the drawing, the first electrode 10a, the first photoelectronic conversion layer 31a, the second photoelectronic conversion layer 32a, and the second electrode 20a are sequentially stacked, but the present disclosure is not limited thereto, and they may be stacked in the order of the second electrode 20a, the second photoelectronic conversion layer 32a, the first photoelectronic conversion layer 31a, and the first electrode 10a.

The intermediate insulation layer 65 is formed on the first organic photoelectronic device 100a.

The second organic photoelectronic device 100b is formed on the intermediate insulation layer 65.

The second organic photoelectronic device 100b includes a first electrode 10b and a second electrode 20b facing each other, and first and second photoelectronic conversion layers 31b and 32b between the first electrode 10b and the second electrode 20b. The first electrode 10b, the second electrode 20b, and the first and second photoelectronic conversion layers 31b and 32b are the same described above, and the first and second photoelectronic conversion layers 31b and 32b selectively absorb light in one of red, blue, and green wavelength regions. For example, the second organic photoelectronic device 100b may be a blue photoelectronic device.

In the drawing, the first electrode 10b, the first photoelectronic conversion layer 31b, the second photoelectronic conversion layer 32b, and the second electrode 20b are sequentially stacked, but the present disclosure is not limited thereto, and they may be stacked in the order of the second electrode 20b, the second photoelectronic conversion layer 32b, the first photoelectronic conversion layer 31b, and the first electrode 10b.

The upper insulation layer 80 is formed on the second organic photoelectronic device 100b. The lower insulation layer 60, the intermediate insulation layer 65, and the upper insulation layer 80 have a plurality of through-holes exposing the charge storages 55a, 55b, and 55c.

The third organic photoelectronic device 100c is formed on the upper insulation layer 80. The third organic photoelectronic device 100c includes a first electrode 10c and a second electrode 20c facing each other, and first and second photoelectronic conversion layers 31c and 32c between the first electrode 10c and the second electrode 20c. The first electrode 10c, the second electrode 20c, and the first and second photoelectronic conversion layer 31c and 32c are the same described above, and the first and second photoelectronic conversion layers 31c and 32c selectively absorb light in one of red, blue, and green wavelength regions. For example, the third organic photoelectronic device 100c may be a green photoelectronic device.

In the drawing, the first electrode 10c, the first photoelectronic conversion layer 31c, the second photoelectronic conversion layer 32c, and the second electrode 20c are sequentially stacked, but the present disclosure is not limited thereto, and they may be stacked in the order of the second electrode 20c, the second photoelectronic conversion layer 32c, the first photoelectronic conversion layer 31c, and the first electrode 10c.

A focusing lens 96 may be further formed on the third organic photoelectronic device 100c. The focusing lens 96 may control a direction of incident light and gather the light in one region. The focusing lens 96 may have a shape of, for example, a cylinder or a hemisphere, but is not limited thereto.

In the drawing, the first organic photoelectronic device 100a, the second organic photoelectronic device 100b, and the third organic photoelectronic device 100c are for example the organic photoelectronic device of FIG. 1, but the organic photoelectronic device of FIG. 2 may be applied in the same manner.

In the drawing, the first organic photoelectronic device 100a, the second organic photoelectronic device 100b, and the third organic photoelectronic device 100c are for example the organic photoelectronic device of FIG. 1, but the present disclosure is not limited thereto. One or two of the first organic photoelectronic device 100a, the second organic photoelectronic device 100b, and the third organic photoelectronic device 100c may be, for example the organic photoelectronic device of FIG. 1.

In the drawing, the first organic photoelectronic device 100a, the second organic photoelectronic device 100b, and the third organic photoelectronic device 100c are sequentially stacked, but the present disclosure is not limited thereto, and they may be stacked in various orders.

As described above, the first organic photoelectronic device 100a, the second organic photoelectronic device 100b, and the third organic photoelectronic device 100c that absorb light in different wavelength regions have a stack structure, and thus the size of an image sensor may be reduced to realize a down-sized image sensor.

The image sensor may be applied to, for example, various electronic devices including a mobile phone or a digital camera, but is not limited thereto.

Figure 8:
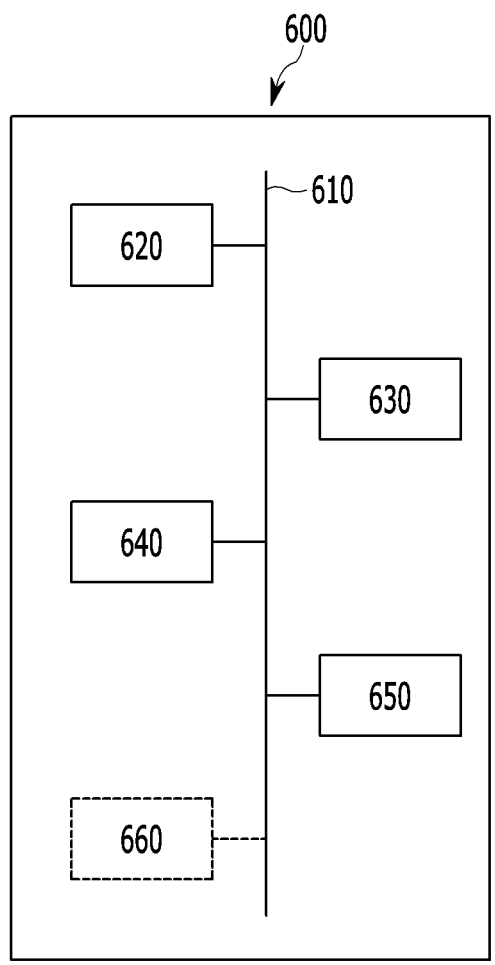
FIG. 8 is a diagram illustrating an electronic device 600 according to example embodiments.

FIG. 8 is a diagram illustrating an electronic device 600 according to some example embodiments.

Referring to FIG. 8, the electronic device 600 includes a memory 620, a processor 630, an image sensor 640, and a communication interface 650. The image sensor 640 may include any of the image sensors illustrated and described herein, including image sensor 300 shown in FIGS. 3-4 and image sensor 400 shown in FIG. 5.

The electronic device 600 may be included in one or more various electronic devices, including, for example, a mobile phone, a digital camera, etc. In example embodiments, the electronic device 600 may include one or more of an image providing server, a mobile device, a computing device, an image outputting device, and an image capturing device. A mobile device may include a mobile phone, a smartphone, a personal digital assistant (PDA), some combination thereof, or the like. A computing device may include a personal computer (PC), a tablet computer, a laptop computer, a netbook, some combination thereof, or the like. An image outputting device may include a TV, a smart TV, some combination thereof, or the like. An image capturing device may include a camera, a camcorder, some combination thereof, or the like.

The memory 620, the processor 630, the image sensor 640, and the communication interface 650 may communicate with one another through a bus 610.

The communication interface 650 may communicate data from an external device using various Internet protocols. For example, the communication interface 650 may communicate sensor data generated by the image sensor 640 to an external device. The external device may include, for example, an image providing server, a display device, a mobile device including, a mobile phone, a smartphone, a personal digital assistant (PDA), a tablet computer, and a laptop computer, a computing device including a personal computer (PC), a tablet PC, and a netbook, an image outputting device including a TV and a smart TV, and an image capturing device including a camera and a camcorder.

The processor 630 may execute a program and control the electronic device 600. A program code to be executed by the processor 630 may be stored in the memory 620. An electronic system may be connected to an external device through an input/output device (not shown) and exchange data with the external device.

The memory 620 may store information output from the image sensor 640, including information transmitted from the transistor 90. The memory 620 may be a volatile or a nonvolatile memory. The memory 620 may be a non-transitory computer readable storage medium. The memory may store computer-readable instructions that, when executed, cause the execution of one or more methods, functions, processes, etc. as described herein. In some example embodiments, the processor 630 may execute one or more of the computer-readable instructions stored at the memory 620.

In some example embodiments, the electronic device may include a display panel 660 that may output an image generated based at least in part upon information output from the image sensor 640.

In some example embodiments, element 660 may be absent from the electronic device 600. In some example embodiments, the communication interface 650 may include a USB and/or HDMI interface. In some example embodiments, the communication interface 650 may include a wireless communication interface.

Hereinafter, the present disclosure is illustrated in more detail with reference to examples. However, these are examples, and the present disclosure is not limited thereto.

Manufacture of Organic Photoelectronic Device I

Example 1

A 150 nm-thick anode is formed by sputtering ITO on a glass substrate. Subsequently, a 5 nm-thick electron blocking layer is formed on the anode by depositing a compound represented by Chemical Formula A. On the electron blocking layer, a 130 nm-thick first photoelectronic conversion layer is formed by depositing a compound represented by Chemical Formula B as a p-type semiconductor and C60 as an n-type semiconductor in a volume ratio of 1.8:1. Subsequently, a 10 nm-thick second photoelectronic conversion layer is formed by codepositing the compound represented by Chemical Formula B as a p-type semiconductor and C60 as an n-type semiconductor in a volume ratio of 1:1. On the second photoelectronic conversion layer, a 7 nm-thick cathode is formed by sputtering ITO. On the cathode, a 50 nm-thick anti-reflection layer is formed by depositing aluminum oxide ($Al_2O_3$), and then, a glass plate is used for sealing to manufacture an organic photoelectronic device.

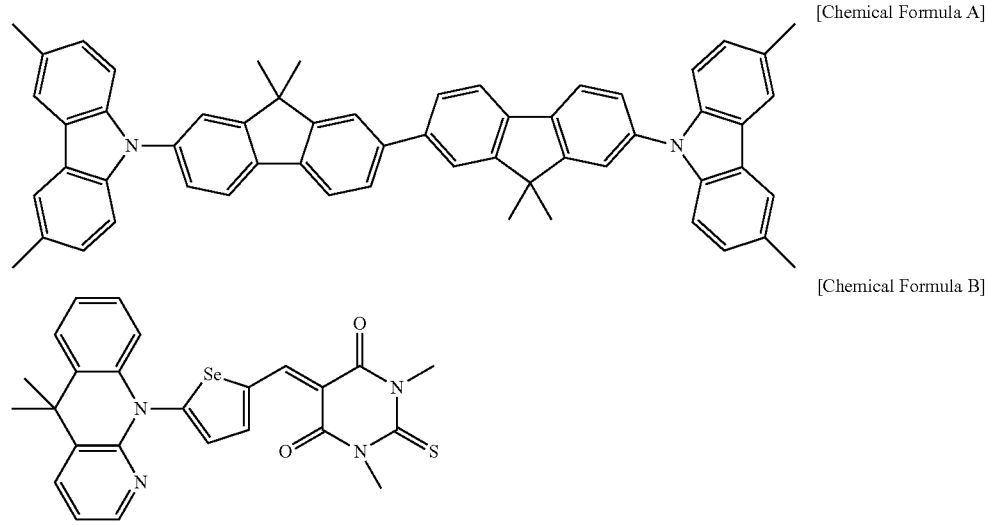

[Chemical Formula A]

[Chemical Formula B]

Example 2

An organic photoelectronic device is manufactured according to the same method as Example 1 except for using the compound represented by Chemical Formula B as a p-type semiconductor and C60 as an n-type semiconductor in a volume ratio of 2.5:1 to form the first photoelectronic conversion layer.

Example 3

An organic photoelectronic device is manufactured according to the same method as Example 1 except for using the compound represented by Chemical Formula B as a p-type semiconductor and C60 as an n-type semiconductor in a volume ratio of 3:1 to form the first photoelectronic conversion layer.

Comparative Example 1

An organic photoelectronic device is manufactured according to the same method as Example 1 except for forming no second photoelectronic conversion layer.

Comparative Example 2

An organic photoelectronic device is manufactured according to the same method as Example 2 except for forming no second photoelectronic conversion layer.

Comparative Example 3

An organic photoelectronic device is manufactured according to the same method as Example 3 except for forming no second photoelectronic conversion layer.
Evaluation I
Evaluation 1
External quantum efficiency (EQE) and a driving voltage of the organic photoelectronic devices according to Examples 1 to 3 and Comparative Examples 1 to 3 are evaluated.

The external quantum efficiency (EQE) is evaluated at 3 V in a wavelength region ($\lambda_{max}$=550 nm) of 400 nm to 720 nm in an Incident Photon to Current Efficiency (IPCE) method. The driving voltage is evaluated as a voltage at the external quantum efficiency (EQE) of 70%.

The results are shown in Table 1.

TABLE 1

|  | EQE$_{550\,nm}$ (%) | Driving voltage (V) |
| --- | --- | --- |
| Example 1 | 69 | 3.5 |
| Comparative Example 1 | 68 | 3.7 |
| Example 2 | 70 | 3.0 |
| Comparative Example 2 | 68 | 3.9 |
| Example 3 | 65 | 4.0 |
| Comparative Example 3 | 62 | 5.0 |

Referring to Table 1, the organic photoelectronic devices according to Examples 1 to 3 show all improved external quantum efficiency (EQE) and driving voltage compared with the organic photoelectronic devices according to Comparative Examples 1 to 3.
Evaluation 2

Heat resistance properties of the organic photoelectronic devices according to Examples 1 to 3 and Comparative Examples 1 to 3 are evaluated.

The heat resistance properties are measured by measuring external quantum efficiency (EQE) (3V, $\lambda_{max}$=550 nm) of the organic photoelectronic devices according to Examples 1 to 3 and Comparative Examples 1 to 3 at 25° C. and their external quantum efficiency (EQE) (3 V, $\lambda_{max}$=550 nm) again after heat-treating them at 160° C. for 3 hours and then, obtaining an external quantum efficiency change (Δ EQE$_{550\,nm}$).

Figure 9:
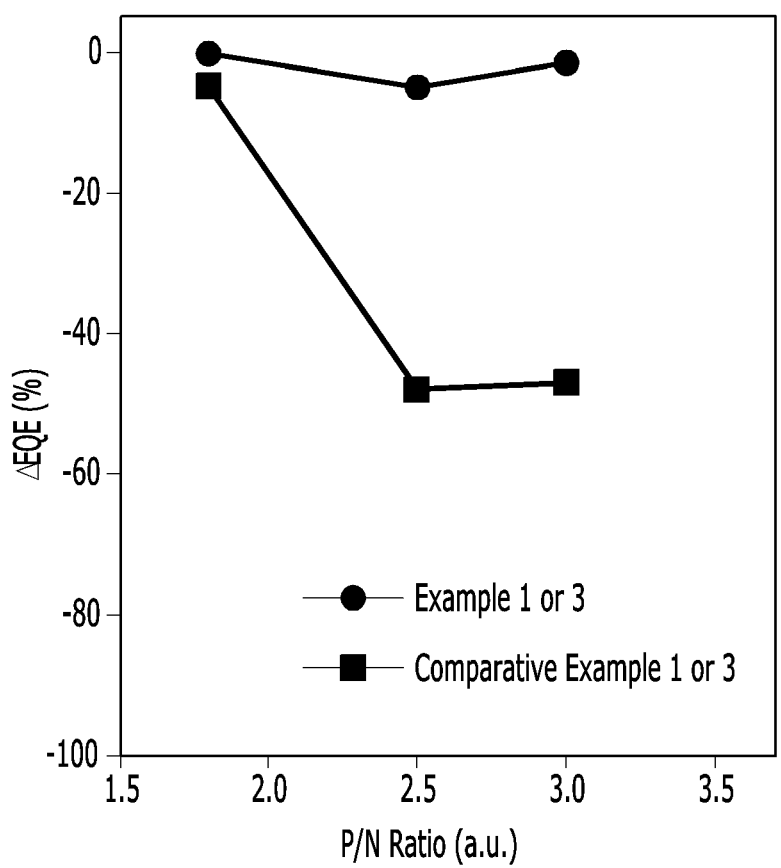
FIG. 9 is a graph showing heat resistance properties of the organic photoelectronic devices according to Examples 1 to 3 and Comparative Examples 1 to 3.
Figure 10:
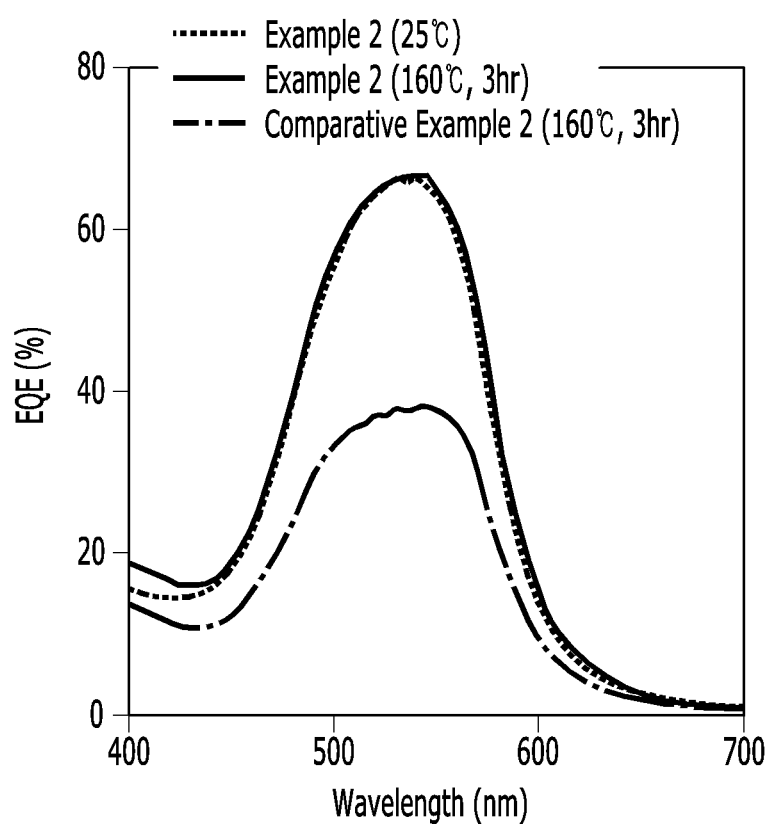
FIG. 10 is a graph showing changes of external quantum efficiency depending on a wavelength of the organic photoelectronic device according to Example 2 before and after heat treatment.

The results are shown in Table 2 and FIGS. 8 to 10.

Figure 11:
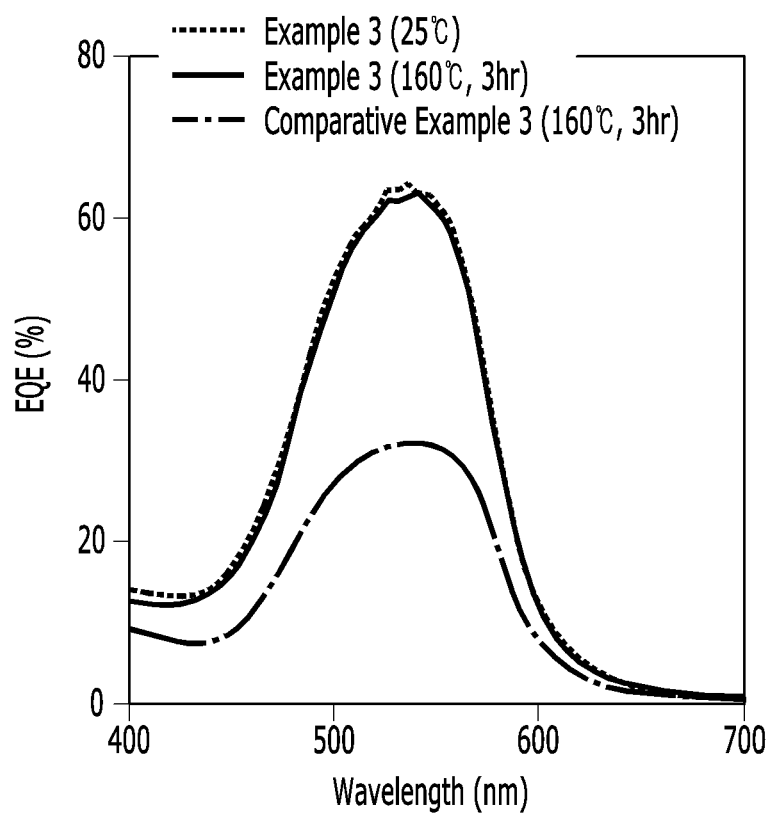
FIG. 11 is a graph showing changes of external quantum efficiency depending on a wavelength of the organic photoelectronic device according to Example 3 before and after heat treatment.

FIG. 9 is a graph showing heat resistance properties of the organic photoelectronic devices according to Examples 1 to 3 and Comparative Examples 1 to 3, FIG. 10 is a graph showing changes of external quantum efficiency depending on a wavelength of the organic photoelectronic device according to Example 2 before and after heat treatment, and FIG. 11 is a graph showing changes of external quantum efficiency depending on a wavelength of the organic photoelectronic device according to Example 3 before and after the heat treatment.

TABLE 2

|  | Δ EQE$_{550\,nm}$ (%) |
| --- | --- |
| Example 1 | −0.1 |
| Comparative Example 1 | −4.8 |

TABLE 2-continued

|  | Δ EQE$_{550\,nm}$ (%) |
| --- | --- |
| Example 2 | −4.8 |
| Comparative Example 2 | −48 |
| Example 3 | −1.6 |
| Comparative Example 3 | −47 |

Referring to Table 2 and FIGS. 9 to 11, the organic photoelectronic devices according to Examples 1 to 3 show a small external quantum efficiency change before and after the heat treatment and thus improved heat resistance properties compared with the organic photoelectronic devices according to Comparative Examples 1 to 3.
Manufacture of Organic Photoelectronic Device II Example 4

A 150 nm-thick anode is formed by sputtering ITO on a glass substrate. Subsequently, a 5 nm-thick electron blocking layer is formed on the anode by depositing a compound represented by Chemical Formula A. On the electron blocking layer, a 97 nm-thick first photoelectronic conversion layer is formed by codepositing a compound represented by Chemical Formula C as a p-type semiconductor and C60 as an n-type semiconductor in a volume ratio of 3.6:1. Subsequently, a 10 nm-thick second photoelectronic conversion layer is formed by codepositing the compound represented by Chemical Formula C as a p-type semiconductor and C60 as an n-type semiconductor in a volume ratio of 1:1. On the second photoelectronic conversion layer, a 7 nm-thick cathode is formed by sputtering ITO. On the cathode, a 50 nm-thick anti-reflection layer is formed by depositing aluminum oxide (Al$_2$O$_3$), and then, a glass plate is used for sealing to manufacture an organic photoelectronic device.

[Chemical Formula C]

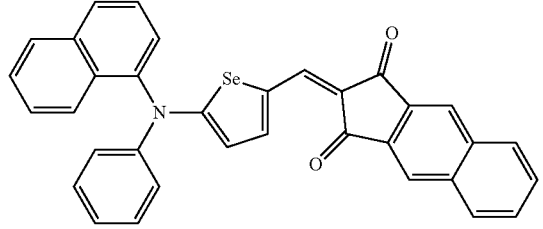

Evaluation II
Evaluation 3

External quantum efficiency (EQE) and a driving voltage of the organic photoelectronic device according to Example 4 are evaluated.

The external quantum efficiency (EQE) are evaluated at 3 V in a wavelength region ($\lambda_{max}$=570 nm) of 400 nm to 720 nm in an Incident Photon to Current Efficiency (IPCE) method. The driving voltage is evaluated as a voltage at the external quantum efficiency (EQE) of 70%.

The results are shown in Table 3.

TABLE 3

|  | EQE$_{570\,nm}$ (%) | Driving voltage (V) |
| --- | --- | --- |
| Example 4 | 69 | 3.25 |

Referring to Table 3, the organic photoelectronic device of Example 4 shows satisfactory external quantum efficiency (EQE) and driving voltage.

Evaluation 4

Heat resistance properties of the organic photoelectronic device according to Example 4 are evaluated.

The heat resistance properties are evaluated by measuring external quantum efficiency (EQE) ($\lambda_{max}$=570 nm) of the organic photoelectronic device according to Example 4 at 25° C. and its external quantum efficiency (EQE) ($\lambda_{max}$=570 nm) again after the heat treatment at 140° C. for 1 hour and then, obtaining an external quantum efficiency (EQE) change ($\Delta$ EQE$_{570\ nm}$).

Figure 12:
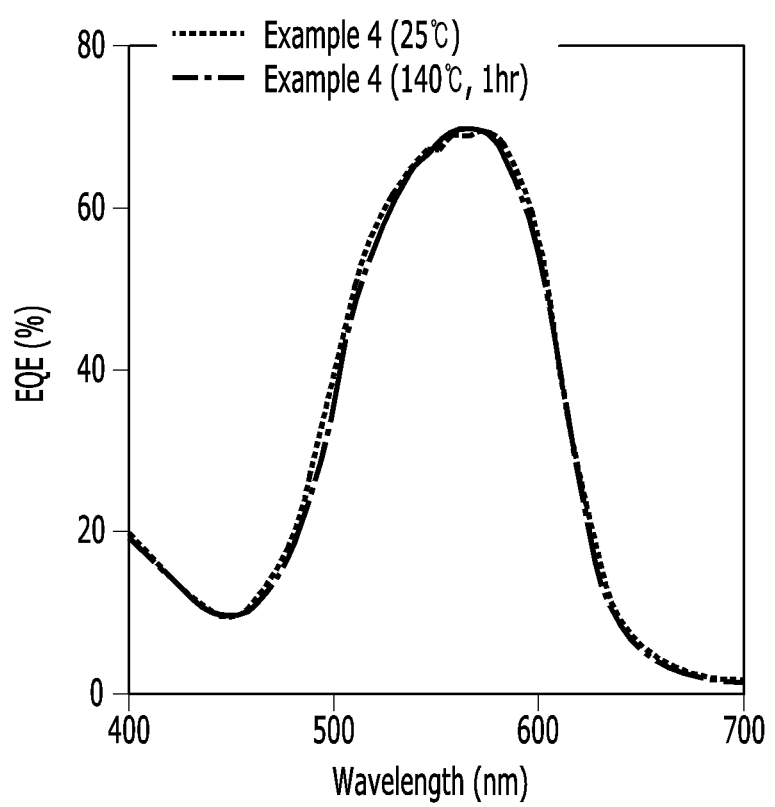
FIG. 12 is a graph showing changes of external quantum efficiency depending on a wavelength of the organic photoelectronic device according to Example 4 before and after heat treatment.

The results are shown in Table 4 and FIG. 12.

FIG. 12 is a graph showing the external quantum efficiency change of the organic photoelectronic device according to Example 4 depending on a wavelength before and after the heat treatment.

TABLE 4

| | $\Delta$ EQE$_{570\ nm}$ ( % ) |
|---|---|
| Example 4 | −1.0 |

Referring to Table 4 and FIG. 12, the organic photoelectronic device of Example 4 shows almost no external quantum efficiency (EQE) change before and after the heat treatment and thus satisfactory heat resistance properties.

While this disclosure has been described in connection with what is presently considered to be practical example embodiments, it is to be understood that the inventive concepts are not limited to the disclosed embodiments, but, on the contrary, is intended to cover various modifications and equivalent arrangements included within the spirit and scope of the appended claims.

What is claimed is:

1. An organic photoelectronic device, comprising:
    a first electrode and a second electrode facing each other; and
    first and second photoelectronic conversion layers between the first electrode and the second electrode, the first and second photoelectronic conversion layers including a p-type semiconductor and an n-type semiconductor, the first photoelectronic conversion layer having a first composition ratio (p$^1$/n$^1$) of the p-type semiconductor relative to the n-type semiconductor, the second photoelectronic conversion layer having a second composition ratio (p$^2$/n$^2$) of the p-type semiconductor relative to the n-type semiconductor, and p$^1$/n$^1$>p$^2$/n$^2$,
    wherein the p-type semiconductor is a light-absorbing material configured to selectively absorb green light having a maximum absorption wavelength in about 520 nm to about 580 nm and is represented by Chemical Formula 1:

[Chemical Formula 1]

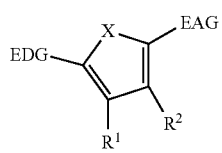

wherein, in Chemical Formula 1,
    X is Se, Te, SO, SO$_2$, or SiR$^a$R$^b$,
    EDG is an electron donating group,
    EAG is an electron accepting group,
    each of R$^1$, R$^2$, R$^a$, and R$^b$ are independently hydrogen or a monovalent substituent, and
    the n-type semiconductor is fullerene or a fullerene derivative.

2. The organic photoelectronic device of claim 1, wherein the first composition ratio (p$^1$/n$^1$) is greater than about 1.5 and less than about 3.5.

3. The organic photoelectronic device of claim 2, wherein the first composition ratio (p$^1$/n$^1$) is about 2.0 to about 3.0.

4. The organic photoelectronic device of claim 1, wherein the second composition ratio (p$^2$/n$^2$) is about 0.8 to about 1.2.

5. The organic photoelectronic device of claim 4, wherein the second composition ratio (p$^2$/n$^2$) is about 1.0.

6. The organic photoelectronic device of claim 1, wherein the p-type semiconductor is a light-absorbing material represented by Chemical Formula 1A or 1B:

[Chemical Formula 1A]

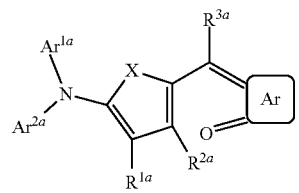

[Chemical Formula 1B]

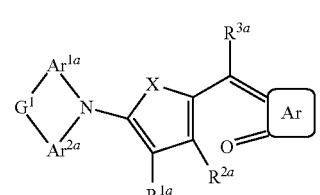

wherein, in Chemical Formula 1A or 1B,
    X is Se, Te, SO, SO$_2$, or SiR$^a$R$^b$,
    Ar is a substituted or unsubstituted 5-membered ring, a substituted or unsubstituted 6-membered ring, or a fused ring of foregoing rings,
    each of Ar$^{1a}$ and Ar$^{2a}$ are independently a substituted or unsubstituted C$_6$ to C$_{30}$ aryl group or a substituted or unsubstituted C$_3$ to C$_{30}$ heteroaryl group,
    G$^1$ is one of a single bond, —(CR$^g$R$^h$)$_{n2}$—, —O—, —S—, —Se—, —N=, —NR$^i$—, —SiR$^j$R$^k$—, and —GeR$^l$R$^m$—, wherein n2 is 1 or 2, and
    each of R$^{1a}$ to R$^{3a}$, R$^a$, R$^b$, and R$^g$ to R$^m$ are independently hydrogen, a substituted or unsubstituted C$_1$ to C$_{30}$ alkyl group, a substituted or unsubstituted C$_6$ to C$_{30}$ aryl group, a substituted or unsubstituted C$_3$ to C$_{30}$ heteroaryl group, a substituted or unsubstituted C$_1$ to C$_6$ alkoxy group, a halogen, or a cyano group.

7. The organic photoelectronic device of claim 1, wherein the p-type semiconductor and the n-type semiconductor of the first photoelectronic conversion layer are uniformly blended at the first composition ratio (p$^1$/n$^1$), and
the p-type semiconductor and the n-type semiconductor of the second photoelectronic conversion layer are uniformly blended at the second composition ratio (p$^2$/n$^2$).

8. The organic photoelectronic device of claim 1, wherein at least one of the p-type semiconductor and the n-type semiconductor is a light-absorbing material configured to selectively absorb one of red light, green light, and blue light.

9. The organic photoelectronic device of claim 1, wherein the second photoelectronic conversion layer is closer to a light receiving side than the first photoelectronic conversion layer.

10. The organic photoelectronic device of claim 1, wherein the first photoelectronic conversion layer is thicker than the second photoelectronic conversion layer.

11. The organic photoelectronic device of claim 10, wherein
the first photoelectronic conversion layer has a thickness of about 5 nm to about 300 nm, and
the second photoelectronic conversion layer has a thickness of about 2 nm to about 40 nm.

12. The organic photoelectronic device of claim 1, wherein the first photoelectronic conversion layer and the second photoelectronic conversion layer contact each other.

13. The organic photoelectronic device of claim 1, wherein
the first electrode is an anode and the second electrode is a cathode,
the first photoelectronic conversion layer is closer to the first electrode than the second photoelectronic conversion layer, and
the second photoelectronic conversion layer is closer to the second electrode than the first photoelectronic conversion layer.

14. An image sensor comprising the organic photoelectronic device of claim 1.

15. An electronic device comprising the image sensor of claim 14.

16. An image sensor comprising:
a semiconductor substrate integrated with at least one first photo-sensing device and at least one second photo-sensing device, the first photo-sensing device configured to sense light in a blue wavelength region and the second photo-sensing device configured to sense light in a red wavelength region; and
at least one third photo-sensing device on the semiconductor substrate, the third photo-sensing device configured to selectively absorb light in a green wavelength region, the third photo-sensing device including the organic photoelectronic device of claim 1.

17. An organic photoelectronic device comprising:
a first electrode;
a first photoelectronic conversion layer on the first electrode, the first photoelectronic conversion layer including a p-type semiconductor and an n-type semiconductor at a first composition ratio ($p^1/n^1$), the first composition ratio ($p^1/n^1$) being greater than about 1.5 and less than about 3.5; and
a second photoelectronic conversion layer on the first photoelectronic conversion layer, the second photoelectronic conversion layer including the p-type semiconductor and the n-type semiconductor at a second composition ratio ($p^2/n^2$), the second composition ratio ($p^2/n^2$) being about 0.8 to about 1.2,
wherein the p-type semiconductor is a light-absorbing material configured to selectively absorb green light having a maximum absorption wavelength in about 520 nm to about 580 nm and is represented by Chemical Formula 1:

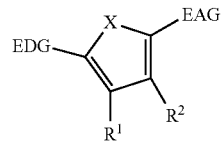

[Chemical Formula 1]

wherein, in Chemical Formula 1,
X is Se, Te, SO, $SO_2$, or $SiR^aR^b$,
EDG is an electron donating group,
EAG is an electron accepting group, and
each of $R^1$, $R^2$, $R^a$, and $R^b$ are independently hydrogen or a monovalent substituent, and
the n-type semiconductor is fullerene or a fullerene derivative.

18. An image sensor comprising:
a semiconductor substrate integrated with at least one first photo-sensing device configured to sense light in a blue wavelength region and at least one second photo-sensing device configured to sense light in a red wavelength region; and
a third photo-sensing device on the semiconductor substrate, the third photo-sensing device configured to selectively absorb light in a green wavelength region, the third photo-sensing device including the organic photoelectronic device of claim 17.

19. An organic photoelectronic device, comprising:
a first electrode and a second electrode facing each other; and
first and second photoelectronic conversion layers between the first electrode and the second electrode, each of the first and second photoelectronic conversion layers including a p-type semiconductor and an n-type semiconductor in a composition ratio (p/n), the composition ratio (p/n) of one of the first and second photoelectronic conversion layers where p>n,
wherein the p-type semiconductor is a light-absorbing material configured to selectively absorb green light having a maximum absorption wavelength in about 520 nm to about 580 nm and is represented by Chemical Formula 1:

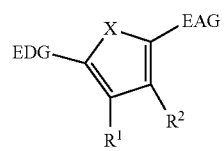

[Chemical Formula 1]

wherein, in Chemical Formula 1,
X is Se, Te, SO, $SO_2$, or $SiR^aR^b$,
EDG is an electron donating group,
EAG is an electron accepting group, and
each of $R^1$, $R^2$, $R^a$, and $R^b$ are independently hydrogen or a monovalent substituent, and
the n-type semiconductor is fullerene or a fullerene derivative.

20. The organic photoelectronic device of claim 19, wherein the composition ratio (p/n) of the one of the first and second photoelectronic conversion layers is greater than about 1.5 and less than about 3.5.

21. The organic photoelectronic device of claim 19, wherein the composition ratio (p/n) of the other of the first and second photoelectronic conversion layers is about 0.8 to about 1.2.

* * * * *